United States Patent [19]
Rudolph et al.

[11] Patent Number: 5,853,485
[45] Date of Patent: Dec. 29, 1998

[54] PRESSURE GRADIENT CVI/CVD APPARATUS PROCESS AND PRODUCT

[75] Inventors: James W. Rudolph, Colorado Springs, Colo.; Mark J. Purdy, Akron, Ohio

[73] Assignee: The B. F. Goodrich Company, Richfield, Ohio

[21] Appl. No.: 851,860

[22] Filed: May 6, 1997

Related U.S. Application Data

[60] Continuation of Ser. No. 476,951, Jun. 6, 1995, abandoned, which is a division of Ser. No. 340,150, Nov. 15, 1995, abandoned.

[51] Int. Cl.$^6$ .................................................. C23C 16/00
[52] U.S. Cl. ........................... 118/715; 118/725; 118/728
[58] Field of Search ................................ 118/715, 725, 118/726, 728

[56] References Cited

U.S. PATENT DOCUMENTS

| | | | |
|---|---|---|---|
| 3,895,084 | 7/1975 | Bauer | 264/29 |
| 3,991,248 | 11/1976 | Bauer | 428/245 |
| 4,134,360 | 1/1979 | Fisher et al. | 118/49.1 |
| 4,212,906 | 7/1980 | Fisher et al. | 427/237 |
| 4,369,031 | 1/1983 | Goldman | 432/198 |
| 4,580,524 | 4/1986 | Lackey, Jr. et al. | 118/725 |
| 4,895,108 | 1/1990 | Caputo et al. | 118/728 |
| 5,190,913 | 3/1993 | Higashiyama | 505/1 |
| 5,250,323 | 10/1993 | Miyazaki | 427/255.1 |
| 5,252,134 | 10/1993 | Staufer | 118/726 |
| 5,256,162 | 10/1993 | Drowley | 29/25.01 |
| 5,262,356 | 11/1993 | Fujii | 437/225 |
| 5,269,847 | 12/1993 | Anderson | 118/715 |
| 5,281,295 | 1/1994 | Maeda | 156/345 |
| 5,322,565 | 6/1994 | Ishihara | 118/715 |
| 5,348,774 | 9/1994 | Golecki et al. | 427/543 |
| 5,352,484 | 10/1994 | Bernard et al. | 427/228 |
| 5,362,228 | 11/1994 | Vaudel | 432/120 |
| 5,391,232 | 2/1995 | Kanai | 118/715 |
| 5,439,715 | 8/1995 | Okamura | 427/575 |
| 5,470,390 | 11/1995 | Nishikawa | 118/719 |
| 5,480,678 | 1/1996 | Rudolph | 427/248.1 |

FOREIGN PATENT DOCUMENTS

| | | |
|---|---|---|
| 550058 A2 | 12/1992 | European Pat. Off. . |
| 0592239 A2 | 4/1994 | European Pat. Off. ........ C04B 35/52 |
| 3922539 | 1/1991 | Germany . |
| 62-66353 | 7/1987 | Japan ..................................... 118/719 |
| 63-295476 | 12/1988 | Japan . |
| 4108680 | 4/1992 | Japan . |
| 8704733 | 8/1987 | WIPO . |
| 8810245 | 12/1988 | WIPO . |

OTHER PUBLICATIONS

Declaration of William Walthall, Vice President and General Manager, BFGoodrich Aerospace in Phoenix, Arizona, signed Jan. 28, 1998.

Attachment A to the Declaration of William Walthall.

Attachment B to the Declaration of William Walthall.

Attachment C to the Declaration of William Walthall.

Attachment D to the Declaration of William Walthall.

Attachment E to the Declaration of William Walthall.

W.J. Lackey, "Review, Status, and Future of the Chemical Vapor Infiltration Process for Fabrication of Fiber–Reinforced Ceramic Composites", 1989, Ceramic Eng. Sci. Proc. 10(7–8) pp. 577–584.

(List continued on next page.)

*Primary Examiner*—Robert Kunemund
*Assistant Examiner*—Jeffrie R Lund
*Attorney, Agent, or Firm*—Kevin L. Leffel

[57] ABSTRACT

The invention relates to the field of high temperature composites made by the chemical vapor infiltration and deposition of a binding matrix within a porous structure. More particularly, the invention relates to pressure gradient processes for forcing infiltration of a reactant gas into a porous structure, apparatus for carrying out those processes, and the resulting products. The invention is particularly suited for the simultaneous CVI/CVD processing of large quantities (hundreds) of aircraft brake disks.

20 Claims, 17 Drawing Sheets

OTHER PUBLICATIONS

A.J. Caputo & W.J. Lackey, "Fabrication of Fiber–Reinforced Ceramic Composites by Chemical Vapor Infiltration", ORNL/TM–9235, Oak Ridge National Laboratory, Oct. 1984.

M.L. Lieberman & H.O. Pierson, "Effect of Gas Phase Conditions on Resultant Matrix Pryocarbons in Carbon/Carbon Composites", Carbon, 1974, vol. 12, pp. 233–241. Pergamon Press (G.B.).

D.P. Stinton, A.J. Caputo, R.A. Lowden, & T.M. Besmann, "Improved Fiber–Reinforced Sic Composites Fabricated by Chemical Vapor Infiltration", Oak Ridge National Laboratory, American Ceramic Society, Inc., 1986.

O. Vohler, P.L. Reiser & E. Sperk, "Deposition of Pyrolytic Carbon in the Pores of Graphite Bodies—I." and Indroduction To And Results of Deposition Experiments Using Methane, Carbon 1968, vol. 6, pp. 397–403, Pergamon Press (G.B.).

T.M. Bessman, R.A. Lowden, D.P. Stinton & T.L. Starr, "A Method for Rapid Chemical Vapor Infiltraion of Ceramic Composites", Journal De Physique, Colloque C5, supplement au n. 5, Tome 50, May 1989, pp. C5–229 C5–239.

T.Huynh, C.V. Burkland, & B. Bustamante, "Densification of a Thick Disk Preform With Silicon Carbide Matrix by CVI Process", Ceramic Eng. Sci. Proc. 12(9–10) pp. 2005–2014 (1991).

T.D. Gulden, J.L. Kaae, K.P. Norton (General Atomics) & L.D. Thompson (San Diego State University), "Forced–Flow Thermal–Gradient Chemical Vapor Infiltration (CVI) of Ceramic Matrix Composites", Pro–Electrochemical Society (1990), 90–12 (Proc. Int. Conf. Chem. Vap. Deposition, 11th 1990), pp. 546–552.

S. Kimura, N. Takase, S. Kasuya & E. Yasuda, "Fracture Behaviour of C Fiber/CVD C Composite", Carbon '80 (German Ceramic Society), 1980. pp. 617–620.

Alan S. Brown, "Faster Production Processes Cut CCC Costs", article in Aerospace America, Nov. 1994, pp. 18–19.

"Grafoil Brand Flexible Graphite®", Introduction to Grafoil®, Technical Bulletin, Union Carbide Corp., Union Carbide Canada Ltd., SP1004, copyright 1986, one page.

W. V. Kotlensky, "Deposition of Pyrolytic Carbon in Porous Solids", Super–Temp Co., Chemistry and Physics, vol. 9, 1973, pp. 173–262.

M.L. Lieberman, R.M. Curlee, F.H. Braaten, G.T. Noles, "CVD/PAN Felt Carbon/Carbon Composites", Composite Materials, vol. 9, Oct. 1975, pp. 337–348.

W.V. Kotlensky, "A Review of CVD Carbon Infiltration of Porous Substrates", Proc. 16th Nat. Symposium of the Soc. of Aerospace, Mat. & Proc. Eng., Apr. 1971, pp. 257–265.14.

A.J. Caputo, W.J. Lackey, and D.P. Stinton, "Development of a New Fastner Process for the Fabrication of Ceramic Fiber–Reinforced Ceramic Composites By Chemical Vapor Infiltration", Metals and Ceramics Div., Oak Ridge National Laboratory, pp. 694–705.

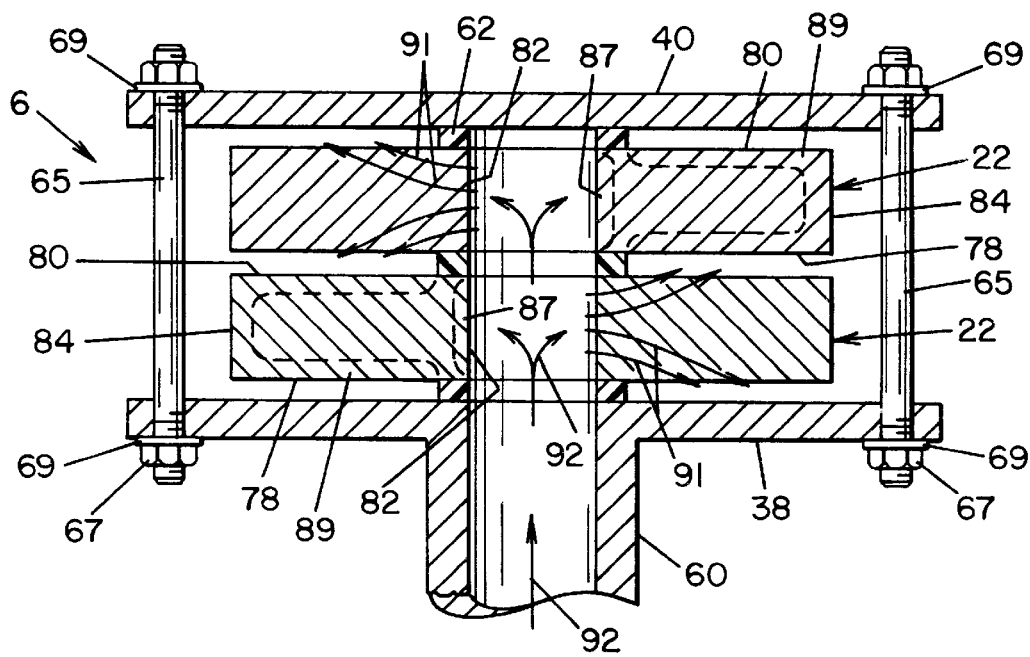
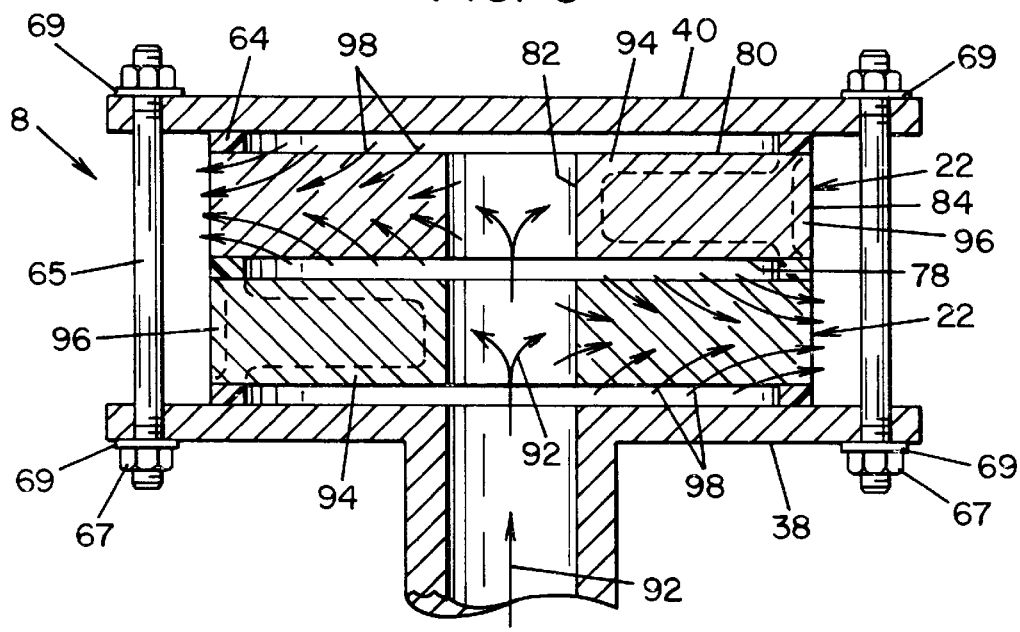

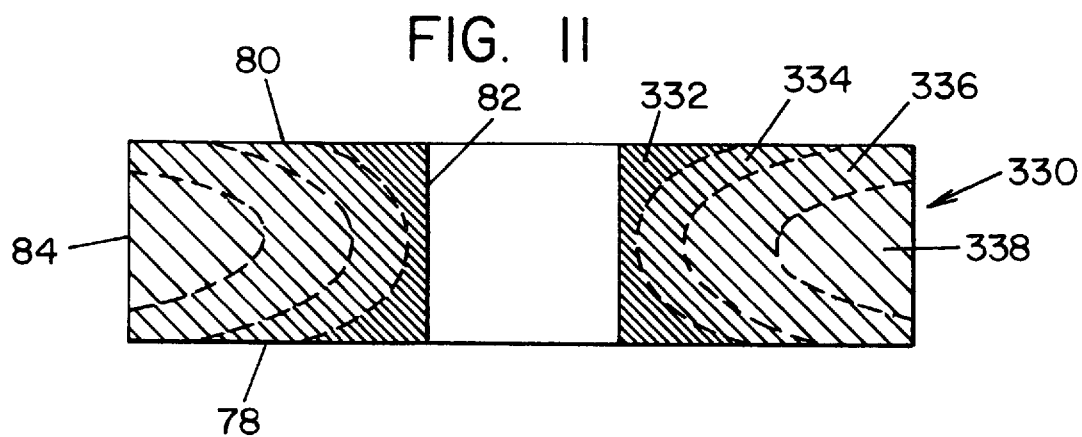
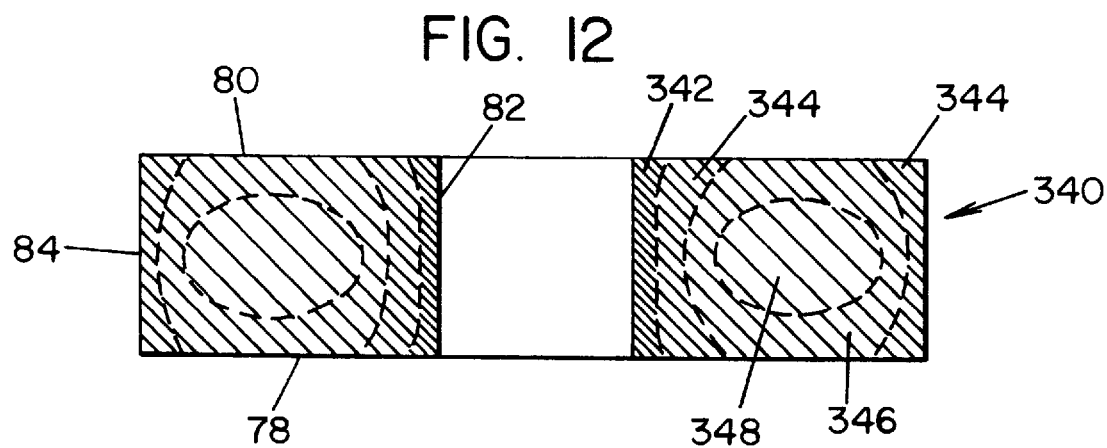
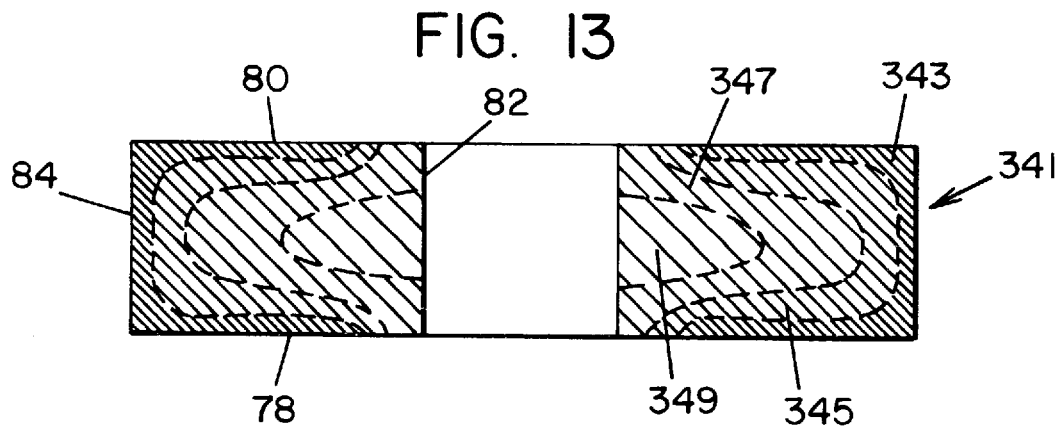

PRESSURE GRADIENT CVI/CVD APPARATUS PROCESS AND PRODUCT

This application is a continuation of application Ser. No. 08/476,951 filed Jun. 6, 1995, now abandoned, which is a division of my application for Pressure Gradient CVI/CVD Apparatus, Process And Product, U.S. patent application Ser. No. 08/340,150, filed on Nov. 16, 1994, now abandoned.

BACKGROUND OF THE INVENTION

The invention relates to the field of high temperature composites made by the chemical vapor infiltration and deposition of a binding matrix within a porous structure. More particularly, the invention relates to pressure gradient processes for forcing infiltration of a reactant gas into a porous structure, apparatus for carrying out those processes, and the resulting products.

Chemical vapor infiltration and deposition (CVI/CVD) is a well known process for depositing a binding matrix within a porous structure. The term "chemical vapor deposition" (CVD) generally implies deposition of a surface coating, but the term is also used to refer to infiltration and deposition of a matrix within a porous structure. As used herein, the term CVI/CVD is intended to refer to infiltration and deposition of a matrix within a porous structure. The technique is particularly suitable for fabricating high temperature structural composites by depositing a carbonaceous or ceramic matrix within a carbonaceous or ceramic porous structure resulting in very useful structures such as carbon/carbon aircraft brake disks, and ceramic combustor or turbine components. The generally known CVI/CVD processes may be classified into four general categories: isothermal, thermal gradient, pressure gradient, and pulsed flow. See W. V. Kotlensky, *Deposition of Pyrolytic Carbon in Porous Solids*, 8 Chemistry and Physics of Carbon, 173, 190–203 (1973); W. J. Lackey, *Review, Status, and Future of the Chemical Vapor Infiltration Process for Fabrication of Fiber-Reinforced Ceramic Composites*, Ceram. Eng. Sci. Proc. 10[7–8] 577, 577–81 (1989) (W. J. Lackey refers to the pressure gradient process as "isothermal forced flow"). In an isothermal CVI/CVD process, a reactant gas passes around a heated porous structure at absolute pressures as low as a few millitorr. The gas diffuses into the porous structure driven by concentration gradients and cracks to deposit a binding matrix. This process is also known as "conventional" CVI/CVD. The porous structure is heated to a more or less uniform temperature, hence the term "isothermal," but this is actually a misnomer. Some variations in temperature within the porous structure are inevitable due to uneven heating (essentially unavoidable in most furnaces), cooling of some portions due to reactant gas flow, and heating or cooling of other portions due to heat of reaction effects. In essence, "isothermal" means that there is no attempt to induce a thermal gradient that preferentially affects deposition of a binding matrix. This process is well suited for simultaneously densifying large quantities of porous articles and is particularly suited for making carbon/carbon brake disks. With appropriate processing conditions, a matrix with desirable physical properties can be deposited. However, conventional CVI/CVD may require weeks of continual processing in order to achieve a useful density, and the surface tends to densify first resulting in "seal-coating" that prevents further infiltration of reactant gas into inner regions of the porous structure. Thus, this technique generally requires several surface machining operations that interrupt the densification process.

In a thermal gradient CVI/CVD process, a porous structure is heated in a manner that generates steep thermal gradients that induce deposition in a desired portion of the porous structure. The thermal gradients may be induced by heating only one surface of a porous structure, for example by placing a porous structure surface against a susceptor wall, and may be enhanced by cooling an opposing surface, for example by placing the opposing surface of the porous structure against a liquid cooled wall. Deposition of the binding matrix progresses from the hot surface to the cold surface. The fixturing for a thermal gradient process tends to be complex, expensive, and difficult to implement for densifying relatively large quantities of porous structures.

In a pressure gradient CVI/CVD process, the reactant gas is forced to flow through the porous structure by inducing a pressure gradient from one surface of the porous structure to an opposing surface of the porous structure. Flow rate of the reactant gas is greatly increased relative to the isothermal and thermal gradient processes which results in increased deposition rate of the binding matrix. This process is also known as "forced-flow" CVI/CVD. Prior fixturing for pressure gradient CVI/CVD tends to be complex, expensive, and difficult to implement for densifying large quantities of porous structures. An example of a process that generates a longitudinal pressure gradient along the lengths of a bundle of unidirectional fibers is provided in S. Kamura, N. Takase, S. Kasuya, and E. Yasuda, *Fracture Behaviour of C Fiber/CVD C Composite*, Carbon '80 (German Ceramic Society) (1980). An example of a process that develops a pure radial pressure gradient for densifying an annular porous wall is provided in U.S. Pat. Nos. 4,212,906 and 4,134,360. The annular porous wall disclosed by these patents may be formed from a multitude of stacked annular disks (for making brake disks) or as a unitary tubular structure. For thick-walled structural composites, a pure radial pressure gradient process generates a very large, undesirable density gradient from the inside cylindrical surface to the outside cylindrical surface of the annular porous wall. Also, the surface subjected to the high pressure tends to densify very rapidly causing that surface to seal and prevent infiltration of the reactant gas to low density regions. This behavior seriously limits the utility of the pure radial pressure gradient process.

Finally, pulsed flow involves rapidly and cyclically filling and evacuating a chamber containing the heated porous structure with the reactant gas. The cyclical action forces the reactant gas to infiltrate the porous structure and also forces removal of the cracked reactant gas by-products from the porous structure. The equipment to implement such a process is complex, expensive, and difficult to maintain. This process is very difficult to implement for densifying large numbers of porous structures.

Many workers in the art have combined the thermal gradient and pressure gradient processes resulting in a "thermal gradient-forced flow" process. Combining the processes appears to overcome the shortcomings of each of the individual processes and results in very rapid densification of porous structures. However, combining the processes also results in twice the complexity since fixturing and equipment must be provided to induce both thermal and pressure gradients with some degree of control. A process for densifying small disks and tubes according to a thermal gradient-forced flow process is disclosed by U.S. Pat. No. 4,580,524; and by A. J. Caputo and W. J. Lackey, *Fabrication of Fiber-Reinforced Ceramic Composites by Chemical Vapor Infiltration*, Prepared by the OAK RIDGE NATIONAL LABORATORY for the U.S. DEPARTMENT OF ENERGY under Contract No. DE-AD05-84OR21400 (1984). According to this process, a fibrous preform is disposed within a water cooled jacket. The top of the preform is heated and a gas is forced to flow through the preform to the heated portion where it cracks and deposits a matrix. A process for depositing a matrix within a tubular porous structure is disclosed by U.S. Pat. No. 4,895,108. According to this process, the outer cylindrical surface of the tubular porous structure is heated and the inner cylindrical surface is cooled by a water jacket. The reactant gas is introduced to the inner cylindrical surface. Similar forced flow-thermal gradient processes for forming various articles are disclosed by T. Hunh, C. V. Burkland, and B. Bustamante, *Densification of a Thick Disk Preform with Silicon Carbide Matrix by a CVI Process*, Ceram. Eng. Sci. Proc 12[9–10] pp. 2005–2014 (1991); T. M. Besmann, R. A. Lowden, D. P. Stinton, and T. L. Starr, *A Method for Rapid Chemical Vapor Infiltration of Ceramic Composites*, Journal De Physique, Colloque C5, supplement au n5, Tome 50 (1989); T. D. Gulden, J. L. Kaae, and K. P. Norton, *Forced-Flow Thermal-Gradient Chemical Vapor Infiltration (CVI) of Ceramic Matrix Composites*, Proc.-Electrochemical Society (1990), 90–12 (Proc. Int. Conf. Chem. Vap. Deposition, 11th, 1990) 546–52. Each of these disclosures describes processes for densifying only one porous article at a time, which is impractical for simultaneously processing large numbers of composite articles such as carbon/carbon brake disks.

In spite of these advances, a CVI/CVD process and an apparatus for implementing that process are desired that rapidly and uniformly densifies porous structures while minimizing cost and complexity. Such a process would preferably be capable of simultaneously densifying large numbers (as many as hundreds) of individual porous structures. In particular, a process is desired for rapidly and economically densifying large numbers of annular fibrous preform structures for aircraft brake disks having desirable physical properties.

SUMMARY OF THE INVENTION

According to an aspect of the invention, a CVI/CVD process is provided, comprising the steps of:

partially densifying a porous structure within a CVI/CVD furnace by depositing a first matrix within the porous structure with a pressure gradient CVI/CVD process in which a first portion of the porous structure is subjected to a greater pressure than a second portion of the porous structure and the first portion has a greater bulk density gain than the second portion; and, subsequently densifying the porous structure by depositing a second matrix within the porous structure with at least one additional densification process in which the second portion has a greater bulk density gain than the first portion.

According to another aspect of the invention, a CVI/CVD process is provided, comprising the steps of:

partially densifying a multitude of annular fibrous carbon structures within a CVI/CVD furnace by depositing a first carbon matrix within the annular fibrous carbon structure with a pressure gradient CVI/CVD process in which a first portion of each annular fibrous carbon structure is subjected to a greater pressure than a second portion of each annular fibrous carbon structure and the first portion has a greater bulk density gain than the second portion; and, subsequently densifying the multitude of annular fibrous carbon structures by depositing a second carbonaceous matrix within each annular fibrous carbon structure with at least one additional densification process in which the second portion has a greater bulk density gain than the first portion.

According to yet another aspect of the invention, a friction disk is provided, comprising:

a densified annular porous structure having a first carbon matrix deposited within the annular porous structure and a second carbon matrix deposited within the annular porous structure overlying the first carbon matrix, the densified annular porous structure having two generally parallel planar surfaces bounded by an inside circumferential surface and an outside circumferential surface spaced from and encircling the inside circumferential surface, a first circumferential portion adjacent the inside circumferential surface, and a second circumferential portion adjacent the outside circumferential surface, wherein the first and second circumferential portions are bounded by the two generally parallel planar surfaces, the second circumferential portion having at least 10% less of the first carbon matrix per unit volume relative to the first circumferential portion, the first carbon matrix and the second carbon matrix having a substantially rough laminar microstructure, and the first carbon matrix being more graphitized than the second carbon matrix.

According to still another aspect of the invention, a CVI/CVD process in a CVI/CVD furnace is provided, comprising the steps of:

introducing a reactant gas into a sealed preheater disposed within the CVI/CVD furnace, the sealed preheater having a preheater inlet and a preheater outlet, the reactant gas being introduced into the preheater inlet and exiting the sealed preheater through the preheater outlet and infiltrating at least one porous structure disposed within the CVI/CVD furnace;

heating the at least one porous structure;

heating the sealed preheater to a preheater temperature greater than the reactant gas temperature;

sensing a gas temperature of the reactant gas proximate the outlet;

adjusting the preheater temperature to achieve a desired gas temperature; and, exhausting the reactant gas from the CVI/CVD furnace.

According to still another aspect of the invention, an apparatus is provided for introducing a first reactant gas into a CVI/CVD furnace, comprising:

a first main gas line for supplying the first reactant gas;

a plurality of furnace supply lines in fluid communication with the first main gas line and the CVI/CVD furnace;

a plurality of first flow meters that measure a quantity of first reactant gas flow through each furnace supply line; and, a plurality of first control valves configured to control the quantity of flow of the first reactant gas through each furnace supply line.

According to still another aspect of the invention, a CVI/CVD densification process is provided, comprising the steps of:

densifying a first porous wall within a CVI/CVD furnace by a pressure gradient CVI/CVD process wherein a first flow of reactant gas is forced to disperse through the first porous wall;

densifying a second porous wall by a pressure gradient CVI/CVD process wherein a second flow of reactant gas is forced to disperse through the second porous wall; and, independently controlling the first flow of the reactant gas and the second flow of the reactant gas.

BRIEF DESCRIPTION OF THE DRAWINGS

FIG. 4 presents a sectional view of a fixture according to an aspect of the invention.

FIG. 5 presents a sectional view of a fixture according to an aspect of the invention.

FIG. 11 presents a sectional view of a densified structure according to an aspect of the invention.

FIG. 12 presents a sectional view of a densified structure according to an aspect of the invention.

FIG. 13 presents a sectional view of a densified structure according to an aspect of the invention.

DETAILED DESCRIPTION OF THE INVENTION

The invention and various embodiments thereof are presented in FIGS. 1 through 29 and the accompanying descriptions wherein like numbered items are identical. As used herein, the term "conventional CVI/CVD" is intended to refer to the previously described isothermal CVI/CVD process. The term "pressure gradient CVI/CVD" is intended to refer to the previously described pressure gradient CVI/CVD or forced-flow process and is intended to specifically exclude the previously described thermal gradient and thermal gradient-forced flow processes to the extent that these processes utilize an intentionally induced thermal gradient that affects the deposition process.

Figure 1:
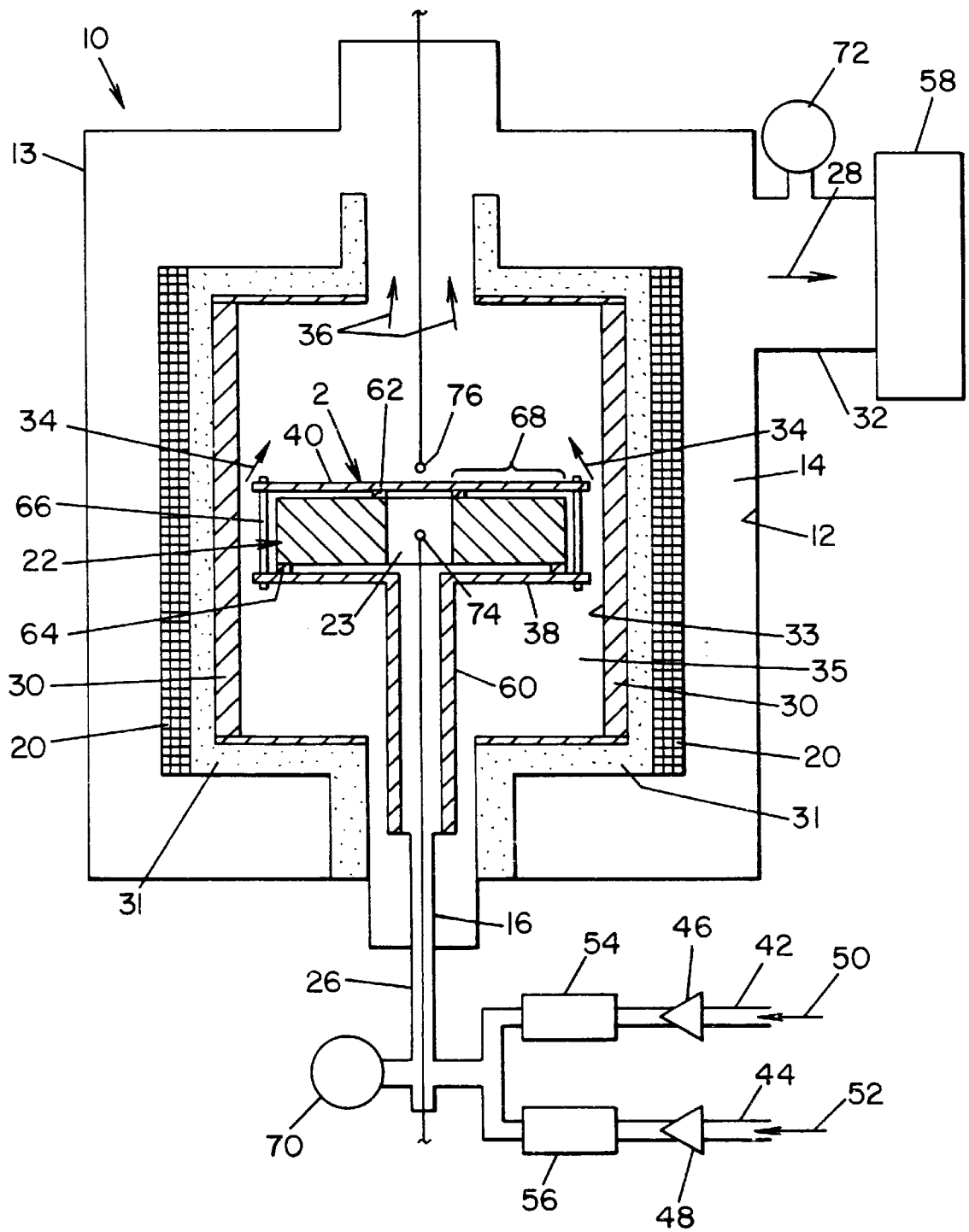
FIG. 1 presents a schematic sectional view of a CVI/CVD furnace according to an aspect of the invention.

Referring now to FIG. 1, a schematic depiction is presented of a CVI/CVD furnace 10 adapted to deposit a matrix within a porous structure 22 by a pressure gradient CVI/CVD process according to an aspect of the invention. The furnace 10 has a shell 13 with an inner surface 12 that defines a furnace volume 14, and a gas inlet 16 for introducing a gas into the furnace 10. A susceptor 30 is disposed around the reactor volume 35 and is induction heated by an induction coil 20 according to methods well known in the art. Other methods of heating may also be utilized such as resistance heating and microwave heating, any of which are considered to fall within the purview of the invention. An insulation barrier 31 is disposed between the susceptor 30 and the induction coil 20. The susceptor 30 has an inner surface 33 that defines a reactor volume 35 which is included within the furnace volume 14. The porous structure 22 is disposed within a fixture 2 in the reactor volume 35 and is predominantly heated by radiation from the susceptor 30. A vacuum apparatus 58 comprising a vacuum pump or steam vacuum system is in fluid communication with an exhaust 32 and evacuates the furnace volume 14 to a pressure below atmospheric pressure. A reactant gas is introduced into the reactor volume 35 through the gas inlet 16 that receives the reactant gas from a furnace supply line 26. The reactant gas infiltrates the porous structure 22 where it cracks and deposits a matrix within the porous structure 22. A single type of gas or mixtures of multiple types of gases may be supplied to the gas inlet 16.

According to a preferred embodiment, the reactant gas comprises a mixture of two reactant gases that are introduced through a first main gas line 42 and a second main gas line 44. The furnace supply line 26 is in fluid communication with the first and second main gas lines 42 and 44 and the inlet 16 thereby serving to transfer the reactant gases to the furnace 10. A first flow meter 46 measures the quantity of flow of a first gas (indicated by arrow 50) introduced into the furnace supply line 26 through the first main supply line 42, and a second flow meter 48 measures the quantity of flow of a second gas (indicated by arrow 52) introduced into the furnace supply line 26 through the second main gas line 44. The flow of gas into furnace supply line 26 is controlled by a first control valve 54 which controls the flow of the first reactant gas from the first main gas line 42, and by a second control valve 56 which controls the flow of the second reactant gas from the second main gas line 44.

The porous structure 22 includes a porous structure aperture 23. A tube 60 is in fluid communication with fixture 2 and the inlet 16 thereby serving to transfer the reactant gas to the fixture 2. The fixture 2 comprises a pair of plates 38 and 40, and the tube 60 is sealed to the gas inlet 16 and to the plate 38. The porous structure 22 is sealed between the plates by ring-like spacers 62 and 64, and the plates 38 and 40 are held together by tie-rods 66. The porous structure 22 forms a porous wall 68 disposed between the inlet 16 and the exhaust 32. The furnace volume 14 and reactor volume 35 are reduced to a pressure below atmospheric pressure, and the gas is introduced to the porous structure aperture 23 at a greater pressure than the reactor volume pressure which develops a pressure gradient through the porous wall 68 and forces dispersion of the gas through porous structure 22 before being withdrawn from the reactor volume 35 and the furnace volume 14 by the vacuum apparatus 58 as indicated by arrows 34, 36, and 28.

Pressure inside the furnace volume is measured by an exhaust pressure sensor 72, and pressure inside the porous structure aperture 23 is measured by an inlet pressure sensor 70. An approximate reactant gas temperature inside the porous structure aperture 23 is measured by a flow temperature sensor 74, and porous structure temperature is approximated by a structure temperature sensor 76 which is placed in close proximity to the plate 40. As will be discussed in more detail, the temperature and pressure conditions are chosen to cause the gas to crack and deposit a matrix having certain desired properties within the porous structure 22. The various aspects of the invention may be used to deposit any type of CVI/CVD deposited matrix including, but not limited to, carbon or ceramic matrix deposited within carbon or ceramic based porous structures 22. The invention is particularly useful for depositing a carbon matrix within a carbon-based porous structure, and especially for making carbon/carbon composite structures such as aircraft brake disks.

Figure 2:
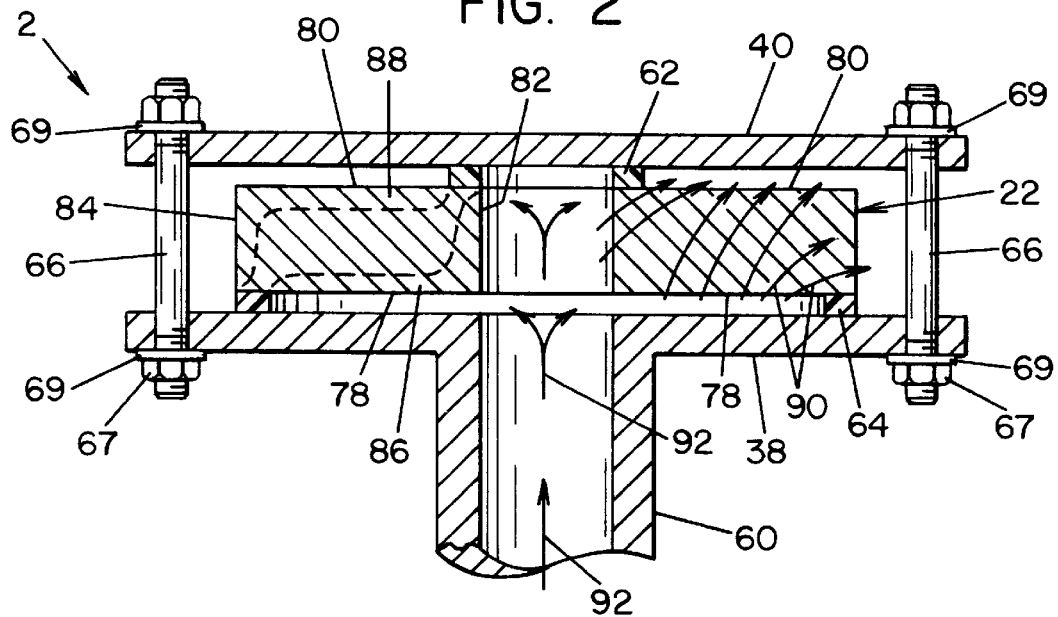
FIG. 2 presents a sectional view of a fixture according for a pressure gradient CVI/CVD process according to an aspect of the invention.

Referring now to FIG. 2, a detailed view of the fixture 2 for holding porous structure 22 is presented. According to a preferred embodiment, the porous structure is annular and has two opposing generally planar surfaces 78 and 80 that are bounded by an inside circumferential surface 82 and an outside circumferential surface 84. An "OD" (outside diameter) type ring-like spacer 64 having a mean diameter less than the outside circumferential surface 84 is placed between the porous structure 22 and the plate 38. An "ID" (inside diameter) type ring-like spacer 62 having a mean diameter slightly greater than the inside circumferential surface 82 is placed between the porous structure 22 and the plate 40. The ring-like spacers 62 and 64 also serve as spacers to permit gas flow between porous structure 22 and the plates 38 and 40, and also seal the porous structure 22 to the plates 38 and 40. The tie-rods 66 may be threaded on one or both ends and include nuts 67 in threaded engagement. Washers 69 may be used to distribute the load to the plates 38 and 40.

As discussed previously, the furnace volume is subjected to a vacuum and reactant gas is introduced into the tube 60 at a greater pressure than the furnace volume. Thus, a first portion 86 (indicated by fine crosshatching) of the fibrous structure 22 is subjected to a greater pressure than a second portion 88 (indicated by fine crosshatching) of the fibrous structure 22 which induces dispersion of the reactant gas through the porous structure 22 as indicated by the arrows 90. As gas disperses through the porous structure, additional gas flows through the tube 60 and toward the porous structure 22 as indicated by arrows 92. Thus, reactant gas is continuously supplied and forced to disperse through the porous structure 22. In this example, the first portion 86 includes one surface 78 of the two opposing surfaces 78 and 80, and the second portion 88 includes the other surface 80 of the two opposing surfaces 78 and 80. The first portion 86 also includes the inside circumferential surface 82, and the second portion 88 includes the outside circumferential surface 84.

Figure 3:
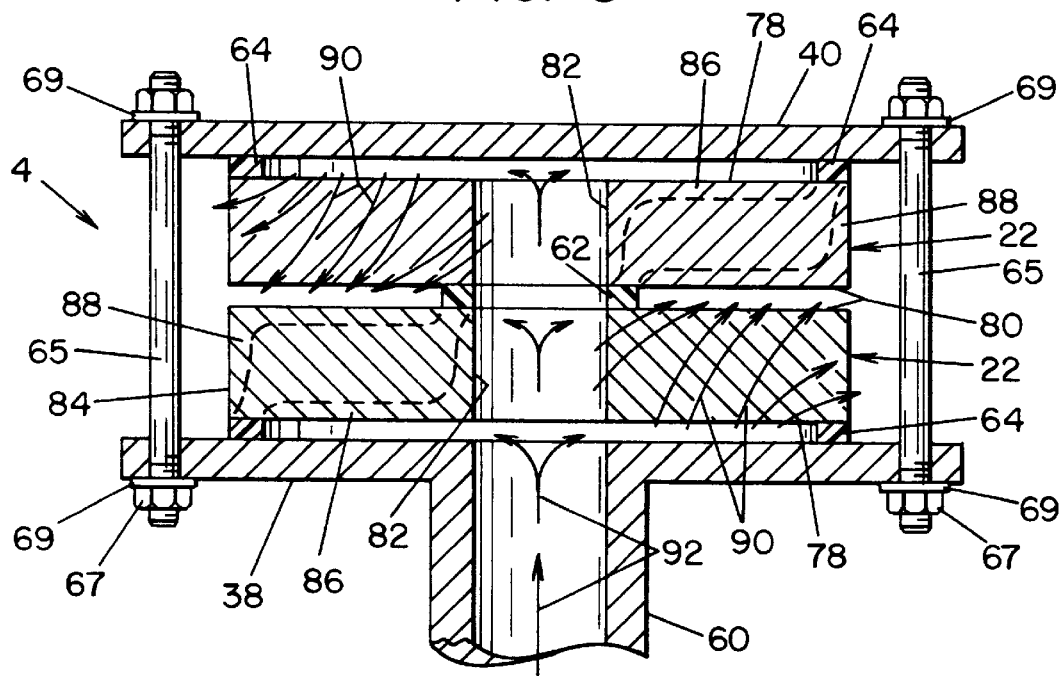
FIG. 3 presents a sectional view of a fixture according to an aspect of the invention.

Referring now to FIG. 3, an alternative fixture 4 that may be used in place of fixture 2 is depicted wherein two porous structures 22 are stacked and simultaneously densified. Two ring-like spacers 64 are utilized and tie-rods 65 are longer versions of the tie-rods 66 of FIG. 2. A pressure gradient is applied to the porous structure (as previously described in relation to FIG. 2) resulting in dispersion of the reactant gas through the porous structures 22 as indicated by arrows 90. Other features of fixture 4 are identical to fixture 2.

Figure 8:
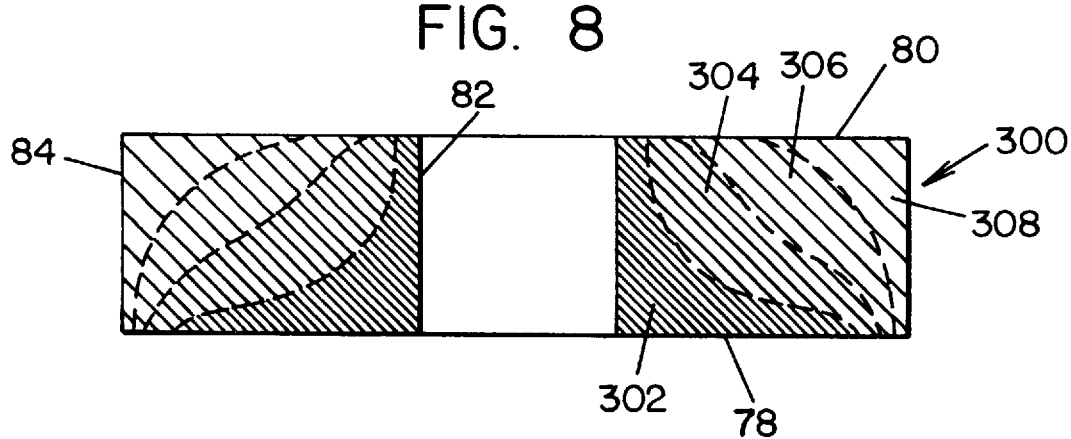
FIG. 8 presents a sectional view of a densified structure according to an aspect of the invention.

The reactant gas tends to crack and preferentially deposit the matrix within the portions of the porous structure 22 subjected to a pressure relatively greater than the pressure in other portions. For example, FIG. 8 presents a densified structure 300 that results from the FIG. 2 and 3 processes beginning with a porous structure 22. The degree of crosshatching is intended to generally indicate relative density: finely crosshatched areas represent greater density relative to coarsely crosshatched areas. The density monotonically decreases from a greatest density zone 302 to a least density zone 308 with density zones 304 and 306 representing intermediate density ranges. The densified structure 300 has an average bulk density, and density zone 302 is typically 110%–140% of the average bulk density, and density zone 308 is typically 60%–90% of the average bulk density. Note that the highest density zone 302 generally corresponds to the first portion 86 and the lowest density zone 308 generally corresponds to the second portion 88. Thus, the first portion 86 has a greater bulk density gain than the second portion 88 during the pressure gradient CVI/CVD process depicted in FIGS. 2 and 3.

Figure 9:
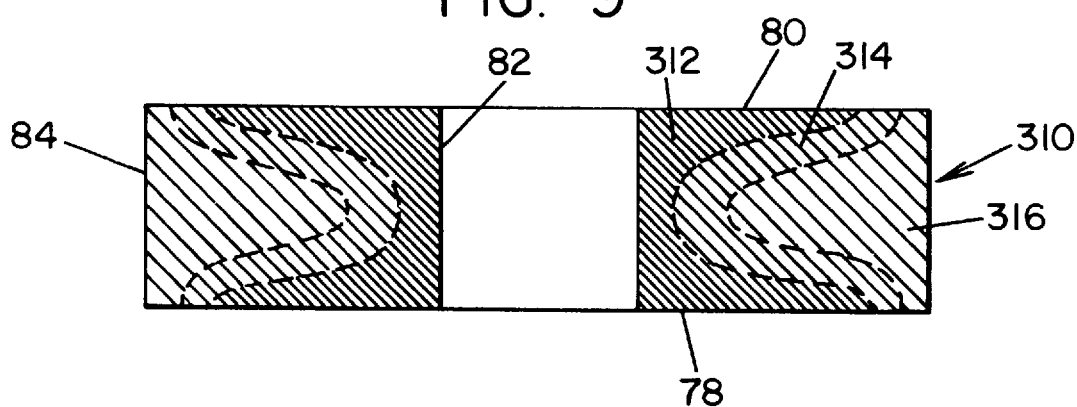
FIG. 9 presents a sectional view of a densified structure according to an aspect of the invention.

The density gradient depicted in FIG. 8 is unacceptable for many applications. The density gradient may be reduced by depositing a first matrix within the porous structure with a pressure gradient CVI/CVD process, as shown in FIGS. 2 and 3. In this first process, the first portion 86 has a greater bulk density gain than the second portion 88, as shown in FIG. 8. Subsequently, the porous structure 22 may be further densified by depositing a second matrix with at least one additional densification process in which the second portion 88 has a greater bulk density gain than the first portion 86. For example, the partially densified structure 300 of FIG. 8 could be flipped and subjected to the pressure gradient CVI/CVD process depicted in FIGS. 2 and 3. The second portion 88 is subjected to a greater pressure than the first portion 86, which results in the second portion 88 having a greater bulk density gain than the first portion 86. FIG. 9 depicts a densified structure 310 resulting from this two-step/flip process. The density monotonically decreases from a greatest density zone 312 to a least density zone 316 with density zone 314 representing an intermediate density range. The densified structure 310 has an average bulk density, and density zone 312 is typically 105%–115% of the average bulk density, and density zone 316 is typically 85%–95% of the average bulk density. The density gradient is now generally symmetrical through the thickness of the porous structure 22 which is desirable for brake disk applications. The density gradient is also less than the density gradient of the densified structure 300 depicted in FIG. 8. The second or additional densification processes may include pressure gradient CVI/CVD, conventional CVI/CVD, and resin impregnation followed by charring. In addition, a porous structure partially densified with a carbon matrix may be heat treated at a temperature greater than the processing temperatures of previous CVI/CVD processes to increase graphitization of the carbon matrix before further depositing additional matrix.

Figure 10:
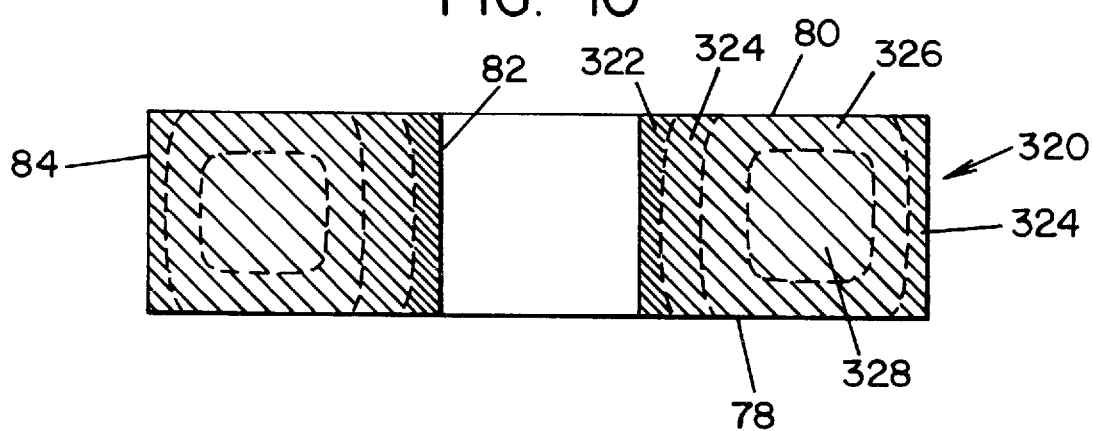
FIG. 10 presents a sectional view of a densified structure according to an aspect of the invention.

Referring now to FIG. 4, another alternative fixture 6 that may be used in place of fixture 2 for an alternative pressure gradient CVI/CVD process is presented. The fixture 6 utilizes all "ID" ring-like spacers 62 resulting in only the inner circumferential surface 82 of each porous structure being subjected to a greater pressure than the reactor volume 35. Thus, a first portion 87 of porous structure 22 is subjected to a greater pressure than a second portion 89 resulting in pressure driven flow of the reactant gas through the porous structures 22 as indicated by arrows 91. In this example, the first portion 87 includes the inside circumferential surface 82, and the second portion 89 includes the outside circumferential surface 84 and two opposing surfaces 78 and 80. The reactant gas tends to quickly flow through the porous structure 22 and exit near the ring-like spacer 62. Thus, reactant gas is not forced to disperse through all of the porous structure 22. FIG. 10 presents a densified structure 320 generated by the FIG. 4 process. The densified structure 320 comprises a zone 322 of greatest density adjacent the inside circumferential surface 82 which drops off to a zone 328 of least density at the core. The density monotonically increases from the least density zone 328 to the greatest density zone 322 with density zones 324 and 326 representing intermediate density ranges. The densified structure 320 has an average bulk density, and density zone 322 is typically about 140% of the average bulk density, and density zone 324 is typically about 115% of the average bulk density. Density zone 328 is typically about 80% of the average bulk density. The zone 322 of greatest density generally corresponds with the first portion 87 of FIG. 4. The region of intermediate density 324 adjacent the outside circumferential surface 84 is generated by a conventional CVI/CVD process induced by reactant gas flow that has not fully cracked exhausting from adjacent porous structures. The densified structure 320 may be further densified by second or additional densification processes which include pressure gradient CVI/CVD, conventional CVI/CVD, and resin impregnation followed by charring.

Referring now to FIG. 5, an alternative fixture 8 that may be used in place of fixture 2 for an alternative pressure gradient CVI/CVD process is presented. The fixture 8 utilizes all "OD" ring-like spacers 64 resulting in the inside circumferential surface 82 and the opposing surfaces 78 and 80 of each porous structure being subjected to a greater pressure than reactor volume 35. The outside circumferential surface 84 is subjected to the pressure of the reactor volume 35. Thus, a first portion 94 of porous structure 22 is subjected to a greater pressure than a second portion 96 resulting in pressure driven flow of the reactant gas through the porous structures 22 as indicated by arrows 98. In this example, the first portion 94 includes the inside circumferential surface 82 and the opposing surfaces 78 and 80, and the second portion 96 includes the outside circumferential surface 84. As depicted, the reactant gas is forced to disperse through all of the porous structure 22. FIG. 11 presents a densified structure 330 generated by the FIG. 5 process. The densified structure 330 comprises a zone 332 of greatest density adjacent the inside circumferential surface 82 and part of the two opposing surfaces 78 and 80. The zone 332 sometimes extends all the way to the outside circumferential surface 84 and includes essentially all of the opposing surfaces 78 and 80. The density monotonically decreases from the greatest density zone 332 to a least density zone 338 with density zones 334 and 336 representing intermediate density ranges. The densified structure 330 has an average bulk density, and density zone 332 is typically 110%–125% of the average bulk density, and density zone 338 is typically 80%–90% of the average bulk density. The FIG. 5 process generates a densified structure 330 that has a symmetric density gradient through the structure thickness. However, the density gradient may be skewed toward one of the surfaces 78 or 80 in some densified structures 330 due to process variations. Note that the zones 332 and 334 generally correspond to the first portion 94 of FIG. 5, and the second portion 96 experiences a relatively less bulk density gain as indicated by zones 336 and 338. The densified structure 330 may be further densified by second or additional densification processes which may comprise pressure gradient CVI/CVD, conventional CVI/CVD, or resin impregnation followed by charring.

Referring now to FIG. 12, a densified structure 340 is presented that is generated by further densifying the porous structure 330 of FIG. 11 by a conventional CVI/CVD process. As shown, the greatest density appears in a zone 342 adjacent the inside circumferential surface 82, which is residual from zone 332 of FIG. 11. The subsequent conventional CVI/CVD process decreases the radial density gradient. This is indicated by a zone 344 of intermediate density adjacent the outside circumferential surface 84. A zone of lesser density 346 encircles a core zone 348 of least density. The subsequent process fills the lower density portions remaining in the densified structure 330 of FIG. 11. Thus, the second portion 96 from the FIG. 5 process experiences a greater bulk density gain than the first portion 94 during the subsequent conventional CVI/CVD process. In addition, the pressure gradient CVI/CVD process generated by the FIG. 5 process produces a desirable porosity distribution in densified structure 330 that renders structure 330 extremely susceptible to subsequent densification by conventional CVI/CVD processes. Densified structure 330 reaches final density quicker and has minimal tendency to sealcoat during subsequent conventional CVI/CVD processes than a structure having the same bulk density that was previously densified by only conventional CVI/CVD processes. This greatly minimizes the need for surface machining operations during the subsequent processes, which greatly simplifies and expedites the entire densification process. This synergistic effect was a surprising discovery.

Figure 6:
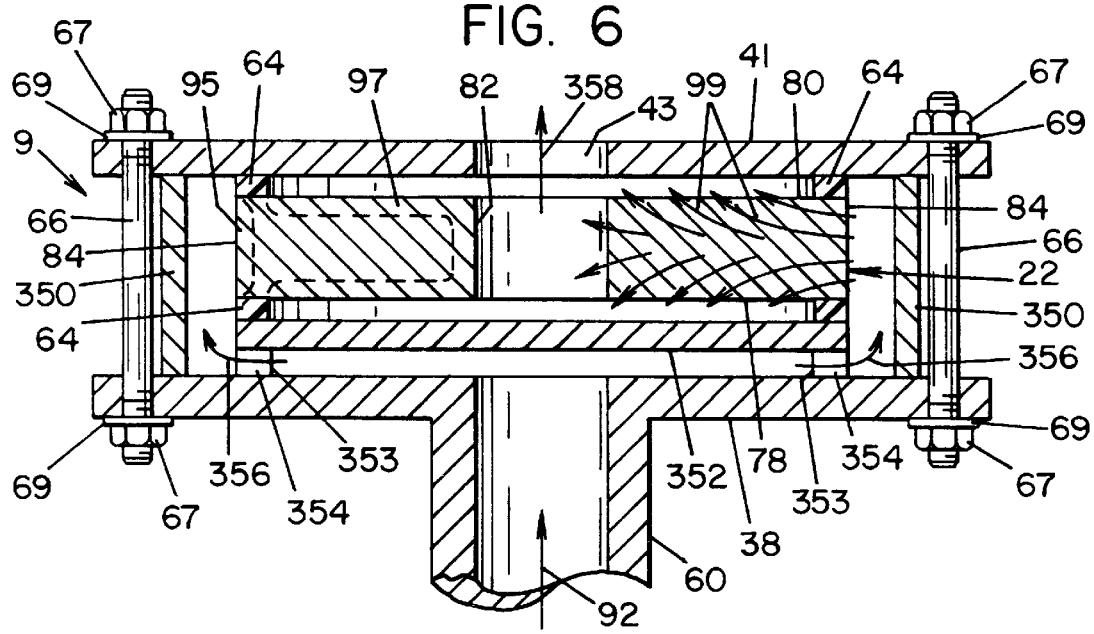
FIG. 6 presents a sectional view of a fixture according to an aspect of the invention.

Referring now to FIG. 6, an alternative fixture 9 that may be used in place of fixture 2 for an alternative pressure gradient CVI/CVD process is presented. The process presented in FIG. 6 is a "reverse flow" process wherein the reactant gas enters the porous structure 22 from the outside rather than the inside of the porous structure 22. This is accomplished by disposing the porous structure 22 between plates 38 and 41. Plate 41 is essentially identical to plate 40 except that plate 41 includes an aperture 43. A cylindrical barrier structure 350 is disposed between and sealed to plates 38 and 41. The barrier structure 350 encircles the porous structure 22. The outside diameter of surface 80 is spaced from and sealed to the plate 41 by an "OD" ring-like spacer 64. The outside diameter of surface 78 is spaced from and sealed by an "OD" ring-like spacer 64 to a seal plate 352, which is disposed between the porous structure 22 and plate 38. A plurality of spacing blocks 353 space the seal plate 352 from the plate 38 thereby forming a plurality of apertures 354. Reactant gas is introduced into fixture 9 the direction of arrow 92. The seal plate 352 forces the gas to flow radially outward and through the apertures 354. The barrier structure 350 then forces the gas to flow upward as indicated by arrows 356 toward the outside circumferential surface 84 of porous structure 22. The aperture 43 in plate 41 subjects the inside of the fixture to the furnace volume pressure which is less than the gas supply pressure in tube 60. Thus, a first portion 95 is subjected to a greater pressure than a second portion 97 which forces the gas to disperse through the porous structure 22 as indicated by arrows 99. The gas exhausts from fixture 9 to the reactor volume 35 through the aperture 43 as indicated by arrow 358. In this example, the first portion 95 includes the outside circumferential surface 84, and the second portion 97 includes the inside circumferential surface 82 and the opposing surfaces 78 and 80. The densified structure may be further densified by second or additional densification processes including pressure gradient CVI/CVD, conventional CVI/CVD, or resin impregnation followed by charring.

Figure 7:
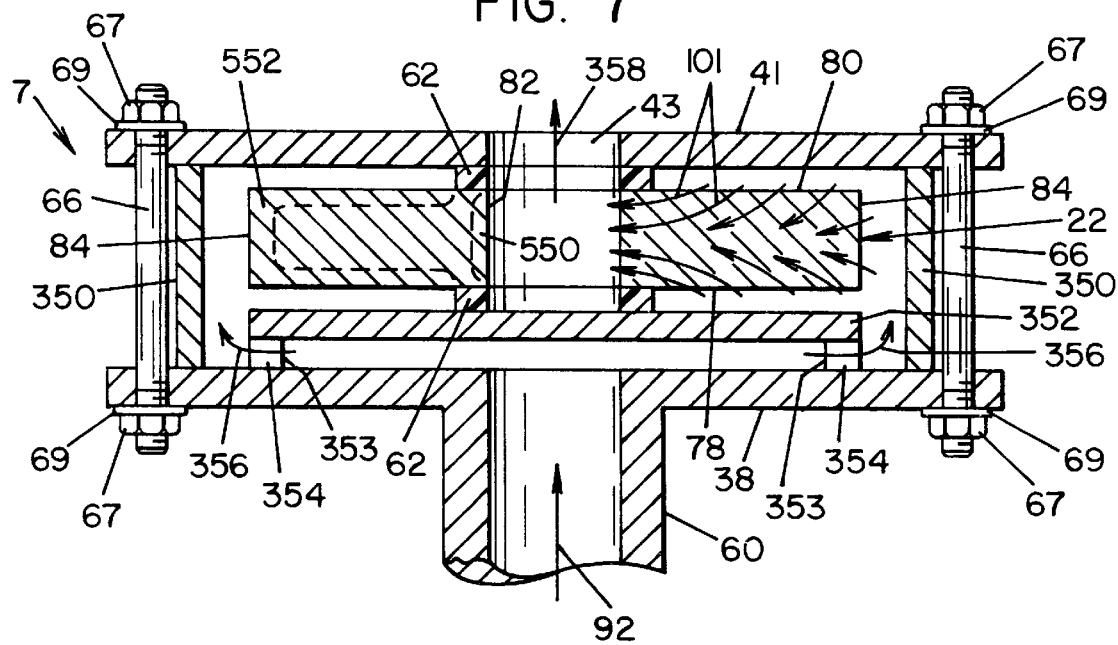
FIG. 7 presents a sectional view of a fixture according to an aspect of the invention.

Referring now to FIG. 7, an alternative fixture 7 that may be used in place of fixture 2 for an alternative pressure gradient CVI/CVD process is presented. FIG. 7 presents a reverse flow process which is very similar to the FIG. 6 process. Fixture 7 is essentially identical to fixture 9, except that fixture 7 comprises "ID" ring-like spacers 62 rather than "OD" ring like spacers 64. The flow of reactant gas enters the opposing surfaces 78 and 80 and the outside circumferential surface 84, and exits the inside circumferential surface 82 of porous structure 22 as indicated by arrows 101. The inside circumferential surface 82 is subjected to the pressure of the reactor volume 35, and the outside circumferential surface 84 and the opposing surfaces 78 and 80 are subjected to the reactant gas supply pressure. Thus, a first portion 552 of porous structure 22 is subjected to a greater pressure than a second portion 550. In this example, the first portion 552 includes the inside circumferential surface 82, and the second portion 550 includes the outside circumferential surface 84 and the opposing surface 78 and 80. FIG. 13 presents a densified structure 341 generated by the FIG. 7 process. The densified structure 341 comprises a zone 343 of greatest density adjacent the outside circumferential surface 84 and part of the two opposing surfaces 78 and 80. The density monotonically decreases from the greatest density zone 343 to a least density zone 349 with density zones 345 and 347 representing intermediate density ranges. The densified structure 341 has an average bulk density, and density zone 343 is typically about 120% of the average bulk density, and density zone 349 is typically about 80% of the average bulk density. The densified structure 341 may be further densified by second or additional densification processes including pressure gradient CVI/CVD, conventional CVI/CVD, or resin impregnation followed by charring.

The various components of fixtures 2, 4, 6, 7, 8 and 9 are preferably formed from graphite, but any suitable high temperature resistant material may be used in the practice of the invention. The various joints may be sealed using compliant gaskets and/or liquid adhesives such as a graphite cement. The porous structures may be pressed against the ring-like spacers to form appropriate seals if the porous structures are compliant before densification. Suitable compliant gaskets may be formed from a flexible graphite such as EGC Thermafoil® brand flexible graphite sheet and ribbon-pack available from EGC Enterprises Incorporated, Mentor, Ohio, U.S.A. Comparable materials are available from UCAR Carbon Company Inc., Cleveland, Ohio, U.S.A.

Figure 14:
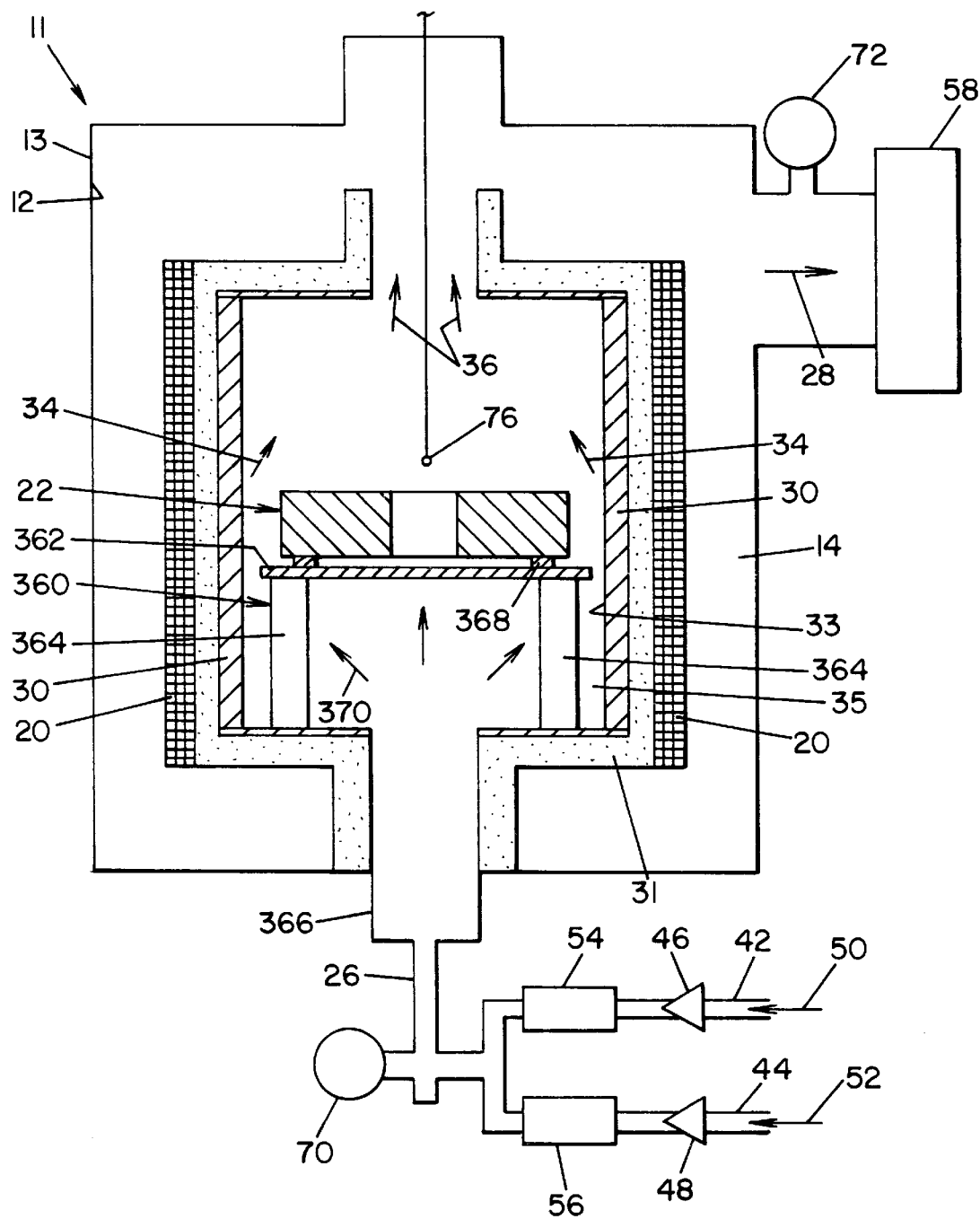
FIG. 14 presents a sectional schematic view of a furnace for a conventional CVI/CVD process.

A conventional CVI/CVD process may be carried out using a CVI/CVD furnace 11 as depicted in FIG. 14. Furnace 11 is very similar to Furnace 10 (see FIG. 1). However the fixture 2 is eliminated and replaced with a fixture 360. Fixture 360 comprises a support plate 362 disposed on a plurality of support posts 364. The porous structure is disposed on a plurality of spacers 368 that separate the porous structure 22 from the plate 362 permitting dispersion of the reactant gas between the plate 362 and the porous structure 22. The support plate 362 has a multitude of perforations (not shown) to permit dispersion of reactant gas through the plate and around the porous structure 22. The support posts 364, spacers 368, and perforated support plate 362 are preferably formed from graphite. Tube 60 of FIG. 1 is replaced by a larger diameter tube 366. Gas enters the furnace volume and freely expands as indicated by arrows 370. The gas passes over the porous structure as indicated by arrows 34 and exhausts from the furnace volume 14 to the vacuum device 58 as indicated by arrows 36 and 28. Normally, only one temperature sensor 76 is used which generally senses the temperature of porous structure 22. The pressure measured by pressure sensor 70 is only slightly greater than the pressure measured by pressure sensor 72 during a conventional CVI/CVD process. A mixture of reactant gases may be introduced from main supply lines 42 and 44, as previously described in relation to FIG. 1.

With each of the FIG. 2 through FIG. 7 fixtures, each annular porous structure 22 has a surface area with a majority (more than 50%) of the surface area of each annular porous structure being exposed to the reactant gas as it enters or leaves the porous structure 22. Establishing a high level of exposure reduces the pressure gradient required to force dispersion of the gas through each porous structure. As much of the porous structure surface area as possible is preferably exposed to the reactant gas. Preferably, at least 80% of the porous structure surface area is exposed.

Figure 15:
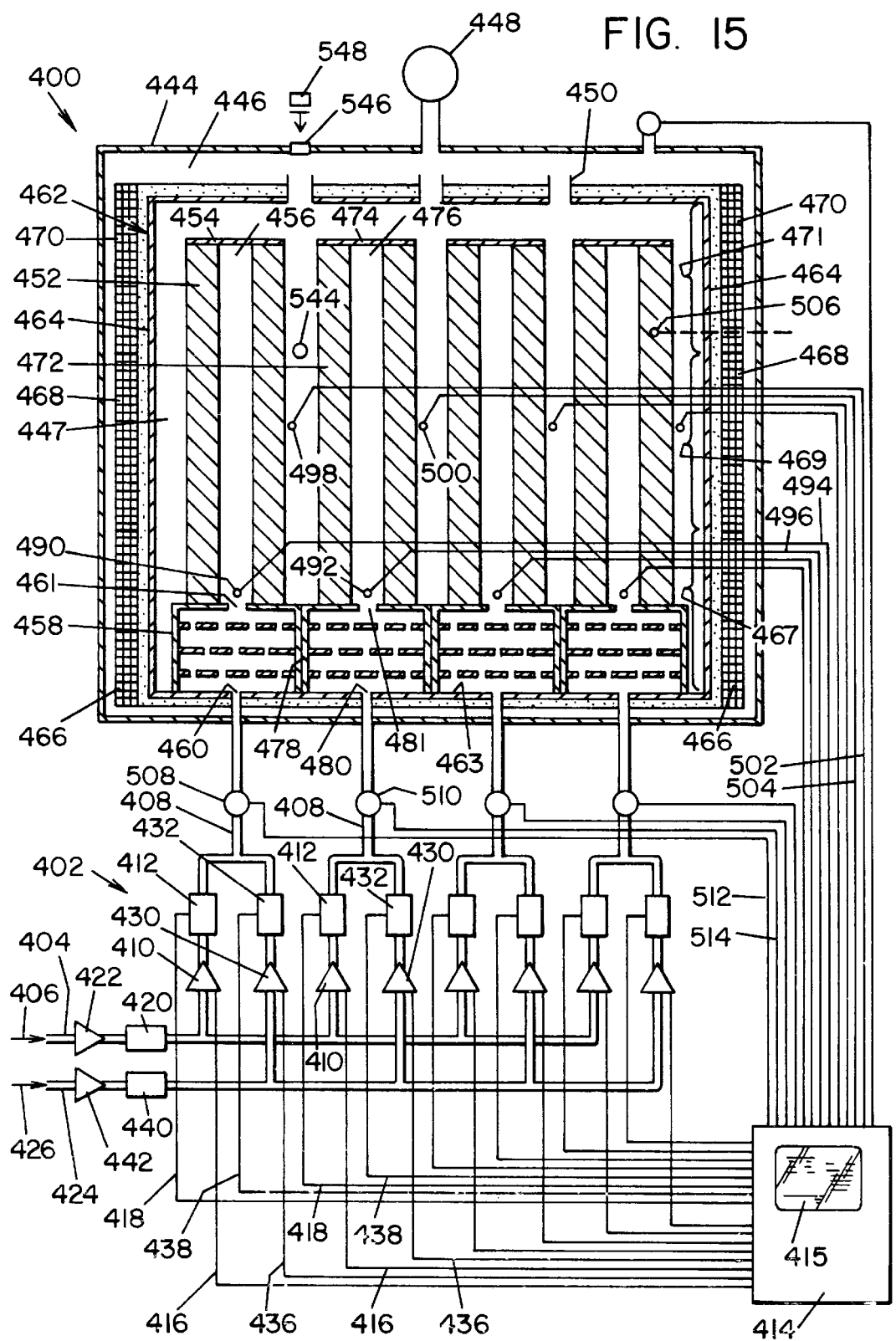
FIG. 15 presents a sectional schematic view of a furnace for simultaneously densifying a large number of porous structures by a pressure gradient CVI/CVD process according to an aspect of the invention.

Referring now to FIG. 15, a CVI/CVD furnace 400 and an apparatus 402 for introducing a first reactant gas into the furnace 400 is presented. Furnace 400 and apparatus 402 are particularly suited for simultaneously densifying large quantities of porous articles, for example five hundred to one thousand annular preforms for manufacturing aircraft brake disks. A first main gas line 404 supplies the first reactant gas as indicated by arrow 406. A plurality of furnace supply lines 408 are in fluid communication with the first main gas line 404 and the CVI/CVD furnace 400. A plurality of first flow meters 410 measures a quantity of first reactant gas flow through each furnace supply line 408. A plurality of first control valves 412 are configured to control the quantity of flow of the first reactant gas through each furnace supply line 408. The quantity of flow may be different for each furnace supply line 408. Apparatus 402 comprises four supply lines 408, four control valves 412, and four flow meters 410, but the invention is not limited to four of each component, since the number may be increased or decreased as required.

According to a preferred embodiment, the furnace 400 and reactant gas supply apparatus 402 are controlled by a controller 414. Each flow meter 410 may communicate the measured quantity of flow to the controller 414 via a first flow sensor line 416, and the controller 414 may control each control valve 412 via a first valve control line 418. Thus, the quantity of flow of the first reactant gas into the furnace 400 may be independently set and controlled for each supply line 408. The controller 414 is preferably micro-processor based and comprises a screen 415 for monitoring the various conditions and control states in the reactant gas supply apparatus 402 and the furnace 400. According to a certain embodiment, each furnace supply line 408 comprises one first flow meter 410 and one first control valve 412, as shown in FIG. 15, and a first main control valve 420 disposed within the first main gas line 404. The first main control valve 420 preferably controls pressure in the first main gas line 404. A first main flow meter 422 may also be disposed within the first main gas line 404.

A mixture of gases may be supplied to furnace 400 by providing at least a second main gas supply line 424 for supplying a second reactant gas as indicated by arrow 426. A plurality of second flow meters 430 are provided that measure a quantity of second reactant gas flow through each furnace supply line 408 with a plurality of second control valves 432 configured to control the quantity of flow of the second reactant gas through each furnace supply line 408. Each second flow meter 430 may communicate the measured quantity of flow to the controller 414 via a second flow sensor line 436, and the controller 414 may control each second control valve 432 via a second valve control line 438. According to a certain embodiment, the second main gas line 424 comprises a second main control valve 440 disposed within the second main gas line 424. A second main flow meter 442 may also be disposed within the second main gas line 424. The second main control valve 440 preferably controls pressure in the second main gas line 424.

The furnace 400 comprises a furnace shell 444 that defines a furnace volume 446. A reactor volume 447 is included within the furnace volume 446. The furnace supply lines 408 are in fluid communication with the reactor volume 447. A vacuum apparatus 448 is in fluid communication with the furnace volume 446 and reactor volume 447 via exhaust stacks 450. The vacuum apparatus 448 reduces the pressure in furnace volume 446 to a vacuum pressure (below atmospheric) and may comprise any suitable device such as a vacuum pump or steam vacuum system with appropriate filters and scrubbers that remove undesirable by-products from the spent reactant gas. The reactant gas from a given furnace supply line 408 is introduced into a corresponding preheater 458. A first preheater 458 is disposed within the reactor volume 447 and has an inlet 460 and an outlet 461. The first preheater 458 is sealed such that substantially all of the reactant gas introduced into the inlet 460 from a corresponding furnace supply line 408 is heated and leaves the preheater through the corresponding outlet 461 where it infiltrates at least one porous structure disposed within the furnace. The term "substantially all of the gas" is intended to allow for a small amount of leakage. The first preheater 458 is heated to a preheater temperature greater than the reactant gas temperature from the corresponding furnace supply line 408. The porous structure is also heated. In this example the porous structure comprises a first porous wall 452 disposed within the reactor volume 447. The first porous wall 452 is preferably annular and comprises a first top plate 454 that seals the upper open end of the first porous wall 452, thereby defining a first enclosed cavity 456. The other end of the first porous wall 452 is sealed against the first preheater 458, with the first preheater outlet 461 in fluid communication with the first enclosed cavity 456.

A first flow of reactant gas is introduced into the first preheater 458, and then passes into the first enclosed cavity 456 at a pressure greater than the pressure within the reactor volume 447. Thus, one side of the first porous wall 452 is subjected to a greater reactant gas pressure than the other side of the first porous wall. In the example shown in FIG. 15, the inner side of the porous wall 452 (the enclosed cavity 456) is subjected to a greater reactant gas pressure than the outer side of porous wall 452. The pressure difference forces the first flow of reactant gas to disperse through the first porous wall 452 where the heated gas cracks and deposits a binding matrix within the heated first porous wall 452. The remaining gas and any by-products then exit the first porous wall 452 and are exhausted from the reactor volume 447 through exhaust stacks 450 by vacuum apparatus 448. Thus, the reactant gas is forced to disperse through the annular porous wall by introducing the reactant gas to the CVI/CVD furnace and exhausting the reactant gas from the CVI/CVD furnace on opposite sides of the annular porous wall. At least one exhaust stack 450 is preferably provided between each pair of porous walls. Also, each preheater 458 may supply reactant gas to more than one annular porous wall 452. Furnace 400 may be heated by any method known in the art for heating a CVI/CVD furnace, including resistance heating and induction heating.

According to a preferred embodiment, the preheater 458 and porous wall 452 are radiation heated by a susceptor 462 that encloses the first preheater 458 and porous wall 452 on all sides. The susceptor 462 defines the reactor volume 447 and a floor 463 upon which the first preheater 458 rests. The susceptor 462 preferably comprises a circumferential portion 464 and the furnace 400 comprises a first induction coil 466, a second induction coil 468, and a third induction coil 470 that encircle the circumferential portion 464. The susceptor 462 is inductively coupled with the induction coils 466, 468, and 470 which transfer energy to the susceptor 462, where it is transformed into heat in a manner well known in the art. Maintaining a uniform temperature from the bottom to the top of a CVI/CVD furnace during densification of a large number of porous structures (hundreds) may be difficult. The rate at which the gas cracks and deposits the binding matrix is largely determined by temperature assuming the reactant gas concentration is sufficient. Thus, variations in porous structure temperature throughout the furnace cause corresponding variations in bulk density gain which can reduce yield during a given CVI/CVD run. Incorporating multiple induction coils, as depicted in FIG. 15, permits application of differing amounts of heat along the length of the furnace. A more uniform porous structure temperature profile along the length of the furnace (in direction of gas flow) may thus be obtained.

According to a further embodiment, a first gas temperature of the first flow of reactant gas is sensed proximate the first preheater outlet 461 by a first temperature sensor 490. Temperature sensor 490 may comprise a Type K thermocouple with appropriate protective sheathing. The preheater temperature may be adjusted to achieve a desired gas temperature. Measuring the preheater temperature directly is not necessary since the preheater temperature is convectively related to the gas temperature at the outlet 461. The preheater temperature is adjusted by increasing or decreasing the heating of the first preheater 458. In FIG. 15, the susceptor wall 464 is comprised of a first susceptor wall portion 467, a second susceptor wall portion 469, and a third susceptor wall portion 471. As previously described, the first induction coil 466 is inductively coupled to the first susceptor wall portion 467 in a manner that transforms electrical energy from the first induction coil 466 to heat energy in the first susceptor wall portion 467. The same applies to the second susceptor wall portion 469 and the second induction coil 468, and the third susceptor wall portion 471 and third induction coil 470. The first preheater 458 is predominantly heated by radiation heat energy from the first susceptor wall portion 467 which is adjacent the first induction coil 466. Thus, the first preheater temperature may be adjusted by adjusting electrical power to the first induction coil 466. The electrical power to the second induction coil 468 and 470 may be adjusted as necessary to maintain a desirable porous structure temperature profile along the length of the furnace. The first preheater 458 is preferably disposed proximate the first susceptor wall portion 467 which improves the transfer of heat energy by radiation. The temperature sensed by first temperature sensor 490 may be transmitted to the controller 414 via a first temperature sensor line 494. The controller may process the temperature sensor information and automatically adjust electrical power to the first induction coil 466 as necessary to achieve a desired temperature of the first gas flow as it leaves the first preheater outlet 461. In certain furnace arrangements, a preheater may be disposed proximate the center of the furnace and surrounded by adjacent preheaters that are proximate the susceptor wall and block transfer of heat energy by radiation to the center preheater. In such a case, the center preheater is heated predominantly by conduction from the adjacent preheaters that are heated by radiation. Thus, the center preheater is indirectly heated by radiation from the susceptor wall and the center preheater temperature may be controlled by varying power to the first induction coil 466. Also, the preheaters could be resistance heated which would permit direct control of the heat energy supplied to each preheater. Any such variations are considered to be within the purview of the invention.

A second porous wall 472 may be sealed to a second preheater 478 with the second porous wall having a second top plate 474. The second preheater 478 has a second preheater inlet 480 and a second preheater outlet 481. A second temperature sensor 492 may be provided for sensing the temperature of the second flow of reactant gas as it exits the second preheater outlet 481. The second porous wall 472 defines a second enclosed cavity 476 that is in fluid communication with the second preheater outlet 481. A second flow of gas is introduced to the second preheater through a corresponding furnace supply line 408 and is forced to disperse through the second porous wall 472 and exit the furnace volume 446 in the same manner as described in relation to the first porous wall 452. Thus, one side of the second porous wall 472 is subjected to a greater pressure than the other side of the second porous wall, and at least two of the enclosed cavities 456, 476 may be in fluid communication with a different furnace supply line 408 and sealed within the furnace volume 446 such that a reactant gas flow introduced into each enclosed cavity 456, 476 through the corresponding furnace supply line 408 is forced to disperse through the porous walls 452 and 472 before being withdrawn from said furnace volume 446 by the vacuum apparatus 448. According to a certain embodiment, the second preheater 478 and second porous wall 472 are heated predominantly by radiation from the susceptor wall 464. The second preheater 478 is heated to a preheater temperature greater than the reactant gas temperature from the corresponding furnace supply line 408. The heated gas infiltrates the second porous wall 472 where it cracks and deposits a binding matrix. The remaining gas and any by-products then exit the second porous wall 472 and are drawn out of the furnace volume 446 by vacuum apparatus 448. A second temperature sensor 492 may be provided proximate the second preheater outlet 481. The temperature sensed by second temperature sensor 492 may be transmitted to the controller 414 via a second temperature sensor line 496. The controller 414 may process the temperature sensor information and automatically adjust electrical power to the first induction coil 466 as necessary to achieve a desired temperature of the second gas flow as it leaves the second preheater outlet 481. Electrical power to the first induction coil 466 may also be manually adjusted as necessary in order to achieve the desired gas flow temperature. At least a third porous wall may be densified by a similar pressure gradient CVI/CVD process wherein at least a third flow of reactant gas is forced to disperse through at least the third porous wall by subjecting one side of at least the third porous wall to a greater pressure than the other side of at least the third porous wall, and the third flow of gas may be independently controlled. Additional porous walls may be added and densified in an identical manner using additional furnace supply lines 408 and additional preheaters. Additional preheaters and temperature sensors for sensing temperature of the gas flow proximate the outlet of each additional preheater may be provided as required. Thus, the invention permits simultaneous densification of large numbers of porous walls.

A porous wall temperature sensor 498 may be provided in close proximity to the first porous wall 452 for sensing a first porous wall temperature. The first porous wall temperature may be increased or decreased by increasing or decreasing the first flow of reactant gas that passes through the first porous wall 452. For example, the first flow of reactant gas may be at a lesser temperature than the porous structure as it exits the first preheater outlet 461. Increasing the first flow of reactant gas at this lesser temperature tends to decrease the porous wall temperature and decreasing the flow tends to increase the porous wall temperature. The reverse would apply if the first flow of reactant gas was at a greater temperature than the first porous wall 452. The first porous wall temperature sensor 498 may communicate with the controller 414 via a first porous wall temperature sensor line 502 which permits automatic or manual control of the first gas flow as necessary to achieve a desired first porous wall temperature. A second porous wall temperature may be similarly sensed by a second porous wall temperature sensor 500. The second porous wall temperature sensor 500 may communicate with the controller 414 via a second porous wall temperature sensor line 504 which permits automatic or manual control of the second gas flow as necessary to achieve a desired second porous wall temperature by increasing or decreasing the second gas flow. Temperature of third and additional porous walls may be sensed and controlled in similar manner. Each individual flow of gas from the furnace supply lines 408 may be independently controlled in order to influence the CVI/CVD deposition process by virtue of the reactant gas supply apparatus 402. The porous wall temperature sensors may also be inserted directly in to the porous walls as indicated by temperature sensor 506. A thermocouple may be placed between an adjacent pair of annular porous structures if the porous wall is formed from a stack of porous structures. Porous wall temperature may also be sensed by an optical pyrometer 548 focused through a window 546 on an optical target 544 disposed between an adjacent pair of porous walls 452 and 472.

According to a preferred embodiment, the furnace volume 446 is maintained at a constant vacuum pressure. The pressure inside the first enclosed cavity 456, second enclosed cavity 476, and any third or additional enclosed cavities is determined by the flow of reactant gas introduced into that cavity and the porosity of the corresponding porous wall. For example, the flow into the first enclosed cavity 456 may be maintained at a constant value. At the beginning of the densification process, the pressure inside the first enclosed cavity may be only slightly higher than the furnace volume pressure outside the enclosed cavity. The pressure inside the first enclosed cavity 456 increases as matrix is deposited within the first porous wall 452 because porosity decreases and the quantity of first flow of reactant gas is constant. The pressure inside the first enclosed cavity 456 may be controlled by increasing or decreasing the flow of reactant gas into the first enclosed cavity. Increasing flow increases pressure and decreasing the flow decreases pressure. A first pressure sensor 508 may be provided for sensing the pressure inside the first enclosed cavity 456. The first pressure sensor 508 may communicate via first pressure sensor line 512 with the controller 414 which allows automatic or manual control of the quantity of flow introduced into the first enclosed cavity 456 as necessary to achieve a desired pressure. A second pressure sensor 510 and second pressure sensor line 514 may be provided for controlling the flow and pressure inside the second enclosed cavity 476 in like manner. Third and additional pressure sensors and pressure sensor lines may be provided as required. The quantity of gas flow into a given enclosed cavity is preferably fixed and the pressure allowed to naturally rise as the porous wall densifies unless the pressure rises too rapidly or exceeds a maximum desired pressure, in which case the flow may be reduced or completely stopped. The reactant gas supply apparatus 402 allows independent control of the flow to each porous wall. Monitoring the pressure inside the porous cavity also provides a real time indication of the degree of densification of each porous wall. The lack of a pressure rise, or an unusually slow pressure rise, indicates the presence of a leak in the preheater and/or the porous wall. The process may be terminated and subsequently restarted once the leak is located and fixed. An unusually rapid pressure may indicate sooting or tarring of one or more of the annular porous walls.

Figure 16:
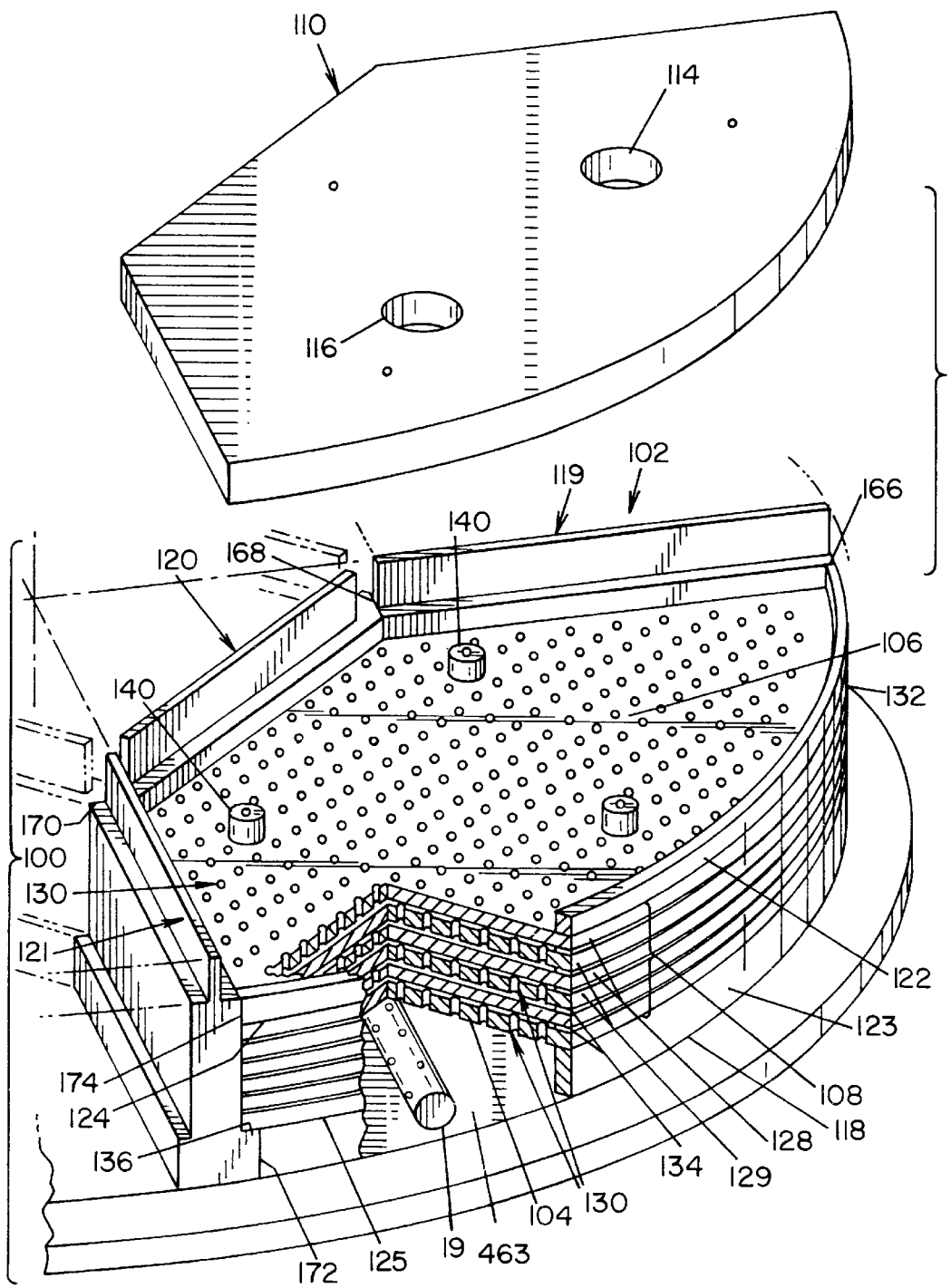
FIG. 16 presents a perspective view of a preheater according to an aspect of the invention.

Referring now to FIG. 16, a preheater 100 is presented which is a preferred embodiment for the preheaters 458 and 478 of FIG. 15. The preheater 100 is described in more detail in U.S. Pat. No. 5,480,678 entitled APPARATUS FOR USE WITH CVI/CVD PROCESSES, filed Nov. 16, 1996, naming James W. Rudolph, Mark J. Purdy, and Lowell D. Bok as inventors, and which is fully incorporated herein by reference. The preheater 100 comprises a sealed duct structure 102 disposed within the furnace 10 and resting on the susceptor floor 463. The preheater 100 receives gas from the gas inlet 460 (FIG. 15). The gas inlet 460 may be connected to one or more perforated tubes 19 which promote dispersion of the gas throughout the sealed duct structure 102. Preheater 100 comprises a sealed baffle structure 108 that rests upon a sealed duct structure 102. The sealed baffle structure 108 comprises an array of spaced perforated plates 128 and 129 with a bottom perforated plate comprising a baffle structure inlet 104 and a top perforated plate comprising a baffle structure outlet 106. The sealed duct structure 102 and sealed baffle structure 108 are sealed to each other, and the sealed duct structure 102 is sealed to the susceptor floor 463 at joint 118 so that gas cannot avoid flowing through the sealed baffle structure 108. The sealed duct structure 102 comprises at least two pieces 119, 120, and 121, upper ring 122 and lower ring 123 which together form several sealed joints 124, 125, 166, 168, 170, 172, and 174. The support bars 119, 120, and 121, and lower ring 123 support the weight of the sealed baffle structure 108. A cover plate 110 preferably adjoins the sealed duct structure 102 disposed over the baffle structure outlet 106. The cover plate 110 serves to support the porous structure fixtures. Cover plate 110 is adapted for use with a pressure gradient CVI/CVD process and comprises a plurality of apertures 114 and 116 with each aperture providing reactant gas to an annular porous wall. The cover plate 110 is sealed to the sealed duct structure 102 by a compliant gasket placed in the joint between the sealed duct structure 102 and the cover plate 110. The perforated plates 128 and 129 are coterminous and arranged in a stack that defines a baffle structure perimeter 132. Each sealed baffle structure plate 128 comprises an array of perforations 130, with the array of perforations 130 of one susceptor plate 128 being misaligned with the array of perforations 130 of an adjcent susceptor plate 129. This arrangement greatly facilitates transfer of heat by radiation from the susceptor wall 464 directly to the perforated plates 128 and 129. The heat is transferred by conduction along plates 128 and 129 and to the gas by forced convection. The baffle structure perimeter 132 is sealed by compliant gaskets 134 and comprises the outer plane-wise limit of each susceptor plate 128 and 129 and is disposed in close proximity to the susceptor wall 464. The compliant gaskets 134 also serve to space the perforated plates 128 and 129 from each other. The sealed duct structure 102 preferably defines a ledge 136 upon which said sealed baffle structure 108 rests. In the embodiment presented, the support bars 119, 120, and 121 define the ledge in combination with lower ring 123. A plurality of posts 140 may be provided that facilitate loading the baffle structure 108 into the furnace and also further support the sealed baffle structure 108 and cover plate 110. Each post 140 comprises an enlarged portion that defines a seat (not shown) which rests on the susceptor floor 463. The sealed baffle structure 108 rests upon the seat. The various components of preheater 100 are preferably formed from monolithic graphite. The various sealed joints are preferably formed using compliant gaskets and/or graphite cement. Suitable compliant gaskets may be formed from a flexible graphite such as EGC Thermafoil® and Thermabraid® brand flexible graphite sheet and ribbon-pack available from EGC Enterprises Incorporated, Mentor, Ohio, U.S.A. Comparable materials are available from UCAR Carbon Company Inc., Cleveland, Ohio, U.S.A.

Figure 17:
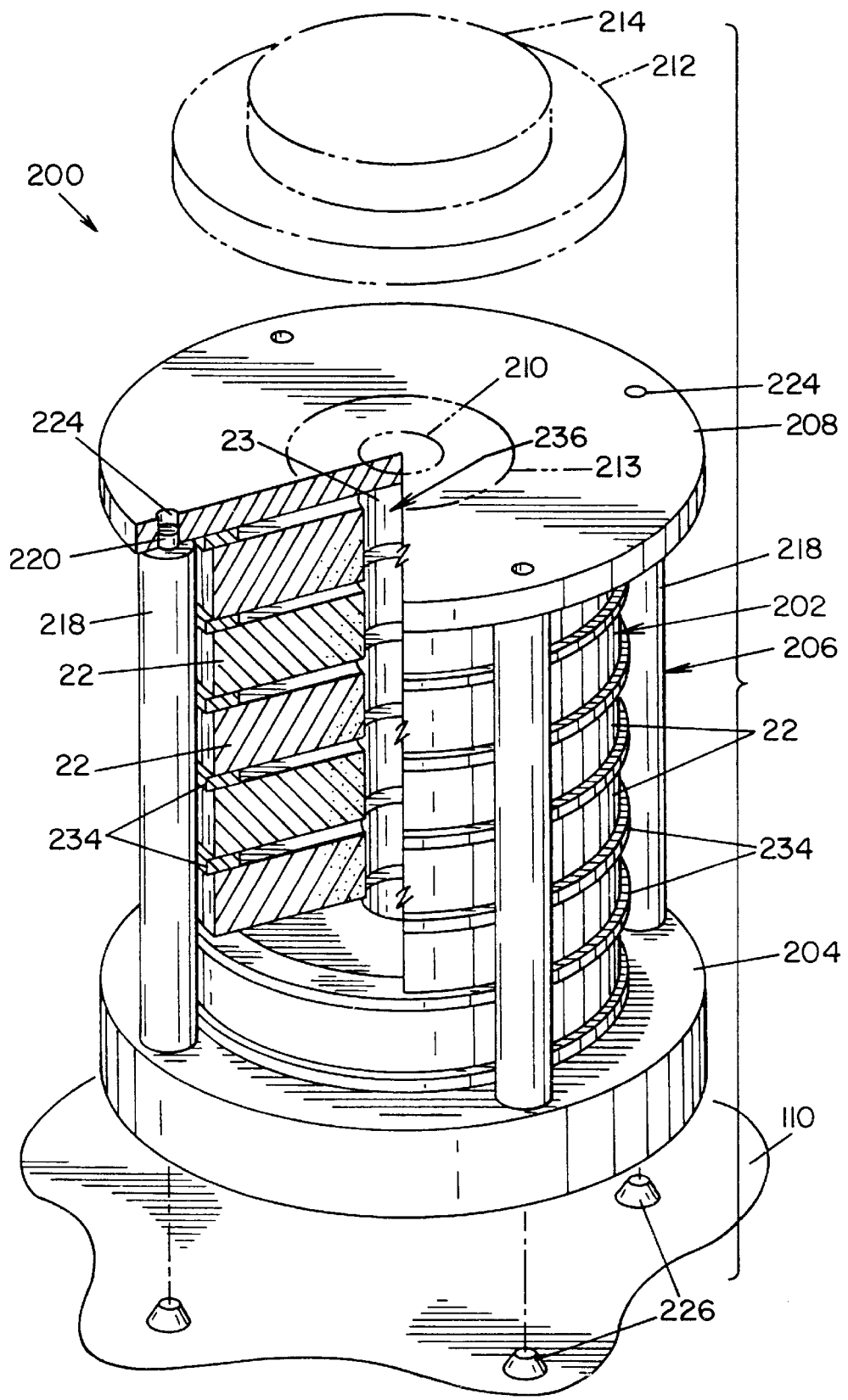
FIG. 17 presents a fixture with porous structures according to an aspect of the invention.

The porous walls 452 and 472 of FIG. 15 may be formed from stacks of annular porous structures, which is particularly preferred for manufacturing aircraft brake disks. Referring now to FIG. 17, a preferred fixture 200 is presented for densifying a stack of annular porous structures 22 by a pressure gradient CVI/CVD process. The fixture 200 is described in more detail in a copending U.S. patent application entitled APPARATUS FOR USE WITH CVI/CVD PROCESSES, filed the same day as the present application naming James W. Rudolph, Mark J. Purdy, and Lowell D. Bok as inventors. Fixture 200 is preferably used with the preheater 100 of FIG. 16. The porous structures 22 are arranged in a stack 202. The fixture comprises a base plate 204, a spacing structure 206, and a top plate 208. The top plate 208 optionally has an aperture 210 which is sealed by a cover plate 212, compliant gasket 213, and weight 214. The base plate 204 is adapted to engage the cover plate 110 and has a base plate aperture (item 216 in FIG. 18) that aligns with one of the cover plate apertures 114 or 116. The base plate 204 is preferably located by a plurality of conical pins 226. The base plate 204 has mating conical base plate holes that are aligned with and receive the conical pins 226. This arrangement facilitates aligning the base plate aperture with a corresponding cover plate aperture. The base plate 204 is preferably sealed to the cover plate 110 by use of a compliant gasket.

The top plate 208 is spaced from and faces the base plate 204. The spacing structure 206 is disposed between and engages the base plate 204 and the top plate 208. In the embodiment presented, the spacing structure comprises a plurality of spacing posts 218 disposed about the stack of porous structures and extending between the base plate 204 and the top plate 208. Each post 218 has pins 220 at either end that are received in mating holes 224 in base plate 204 and top plate 208. The top plate 208 seats upon a stop 264 (see FIGS. 28 and 29) defined by the post 218. The spacing structure 206 preferably comprises at least three posts 218. The spacing structure 206 could also be formed as a single piece, and other arrangements for engaging the base plate 204 and top plate 208 are possible, any of which are considered to be within the purview of the invention. At least one ring-like spacer 234 is disposed within the stack 202 of porous structures 22 between each pair of neighboring porous structures 22. The ring-like spacer 234 encircles the neighboring porous structure apertures 23. At least one of the ring-like spacers 234 is preferably disposed between the base plate 204 and porous structure 22 adjacent the base plate 204, and between the top plate 208 and porous structure 22 adjacent the top plate 208. The base plate 204, the stack of porous structures 202, and the at least one ring-like spacer 234 define an enclosed cavity 236 extending from the base plate aperture (item 216 in FIG. 18), including each porous structure aperture 23, and terminating proximate the top plate 208. According to a certain embodiment, the outside diameter of ring-like spacer 234 is about 21.9 inches and the spacer inside diameter is about 19.9 inches for processing annular porous structures 22 having an outside diameter of about 21 inches. The ring-like spacers are preferably at least 0.25 inch thick.

Figure 18:
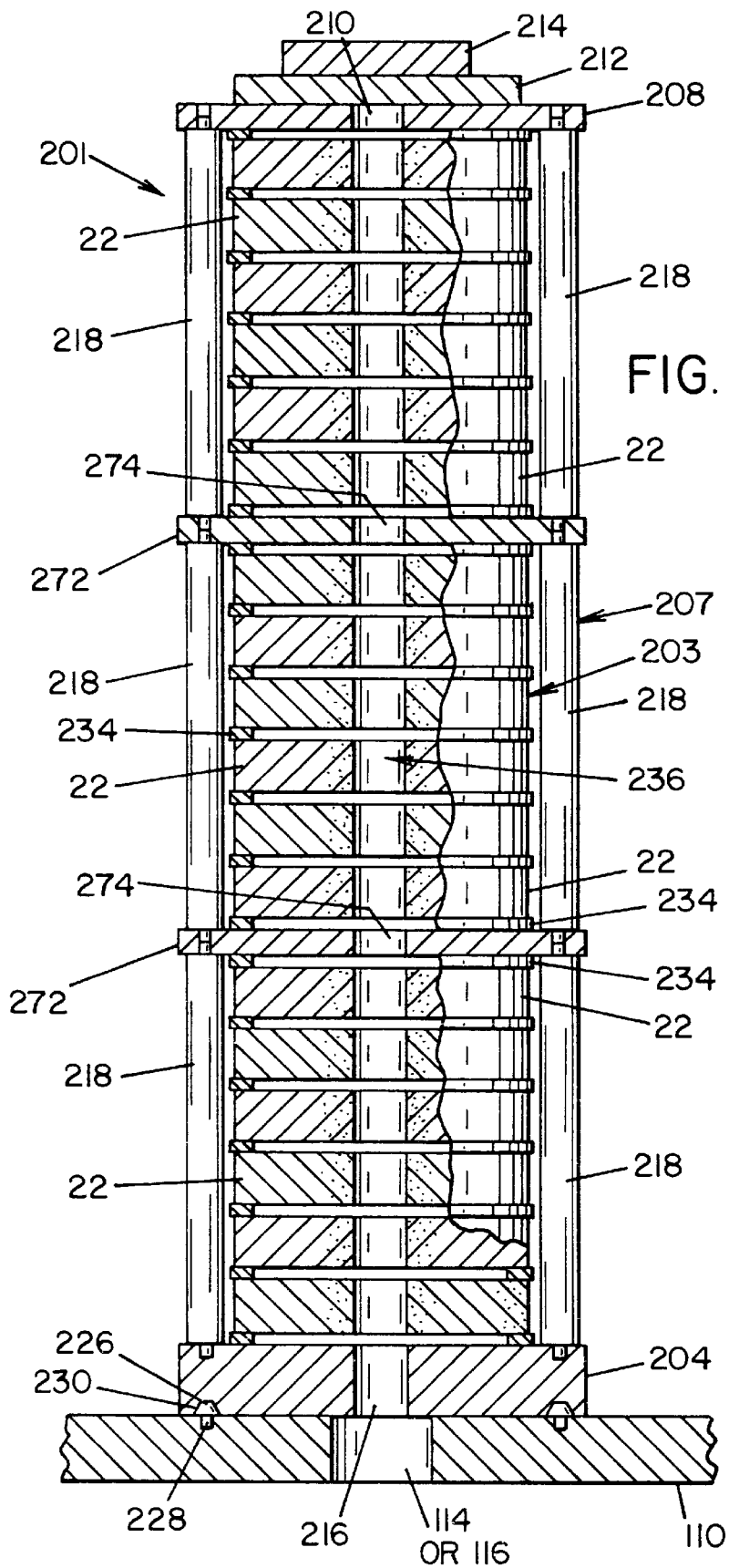
FIG. 18 presents a fixture with porous structures according to an aspect of the invention.

Referring to FIG. 18, a preferred fixture 201 is presented for pressure gradient CVI/CVD densifying simultaneously a large number of porous structures 22. The spacing structure 207 comprises at least one intermediate plate 272 disposed between the base plate 204 and the top plate 208 that divides the stack of porous structures 203. The posts 218 extend between the top plate 208 and one of the intermediate plates 272, between the base plate 204 and another of the intermediate plates 272, and between adjacent pairs of intermediate plates 272. In other respects, fixture 201 is essentially identical to fixture 200. Each intermediate plate 272 has an intermediate plate aperture 274 therethrough is sandwiched between a pair of the porous structures 22. The enclosed cavity 236 further includes each intermediate plate aperture 274. At least one of the ring-like spacers 234 is disposed on either side of and sealed to the intermediate plate 272 between the intermediate plate 272 and the porous structures 22. Multiple fixtures 201 may be stacked. In such case, the base plate 204 from one fixture 201 engages the top plate 208 of a lower fixture 201 with the upper fixture base plate aperture 216 in fluid communication with the lower fixture top plate aperture 210. Thus, the enclosed cavity extends from one fixture 201 to the next until being terminated by the cover plate 212 disposed over the uppermost top plate aperture 210. As shown more clearly in this view, the base plate 204 is provided with conical holes 230 that receive a conical portion of the conical pins 226, and the cover plate 110 is provided with holes 228 that receive a cylindrical portion of the conical pins 226.

Figure 28:
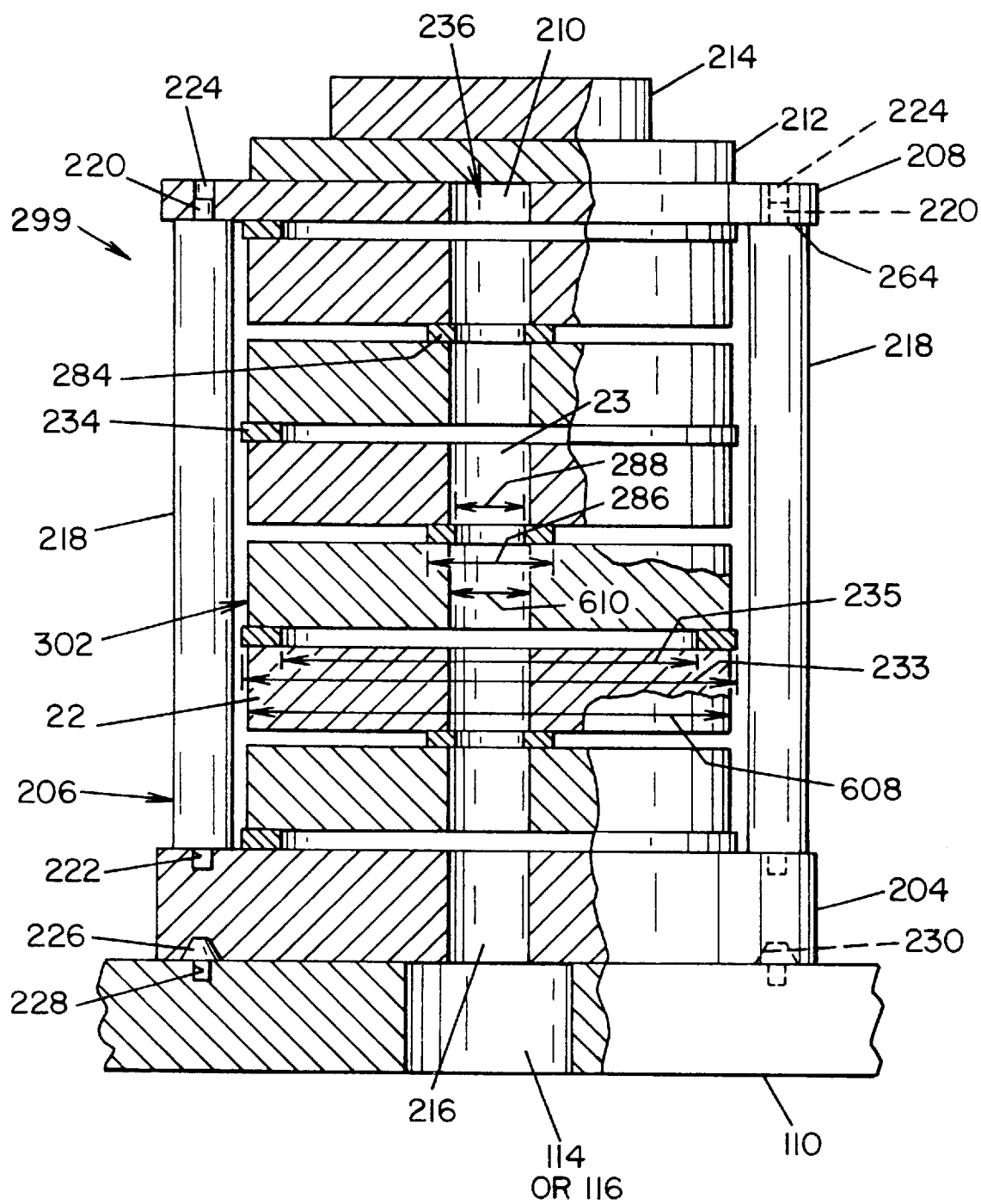
FIG. 28 presents a fixture for holding porous structures having alternating "OD" and "ID" ring-like spacers.
Figure 29:
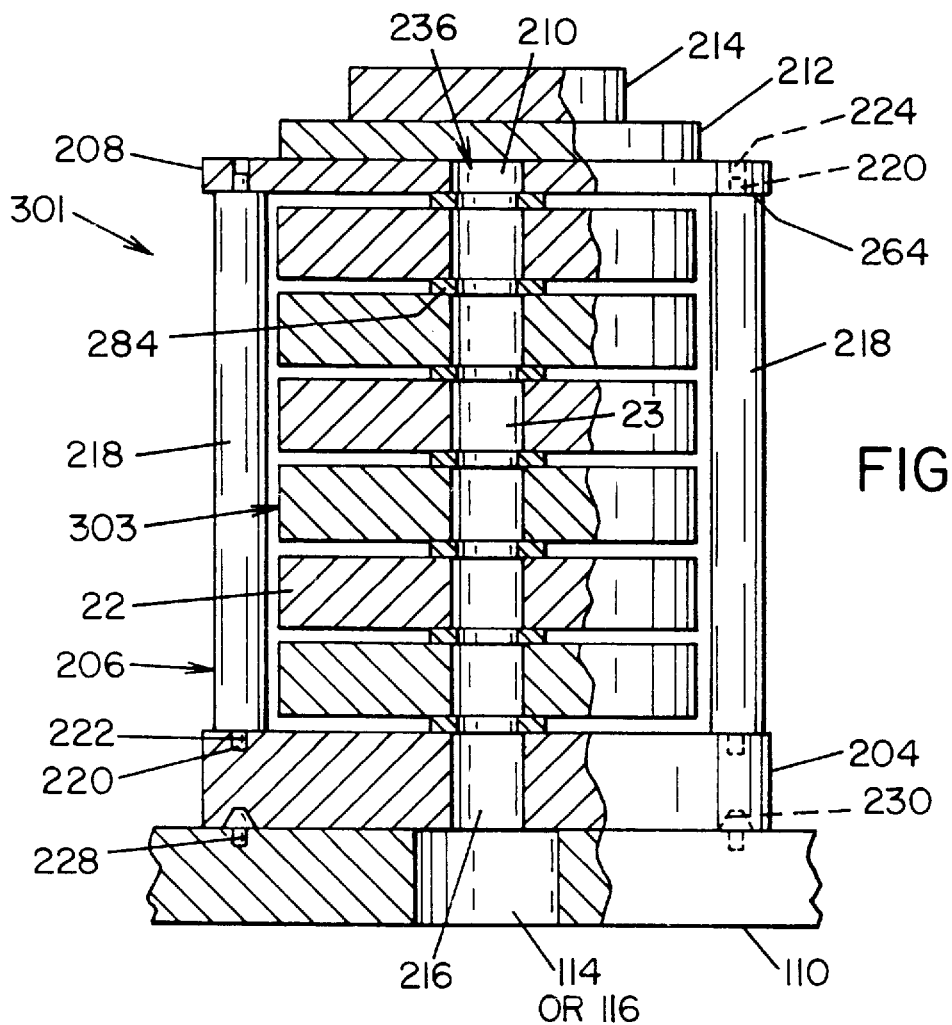
FIG. 29 presents a fixture for holding porous structures having all "ID" ring-like spacers.

Referring now to FIG. 28, an alternative fixture 299 for pressure gradient densifying a stack of porous structures 302 is presented. Fixture 299 is essentially identical to fixture 200, except stack 302 comprises "OD" (outside diameter) ring-like spacers 234 disposed around the outside diameter of each porous structure 22 alternated with "ID" (inside diameter) ring-like spacers 284 disposed around the inside diameter of each porous structure. The OD ring-like spacers 234 preferably have an inside diameter 235 slightly less than the porous structure outside diameter 608, and an outside diameter 233 that is generally coterminous with the porous structure outside diameter 608. The ID ring-like spacers 284 preferably have an outside diameter 286 slightly greater than the porous structure inside diameter 610, and an inside diameter 288 that is generally coterminous with the porous structure inside diameter 610. With ID ring-like spacers 284, the porous structure outside diameter 608 is greater than the outside diameter 286 of the ring like spacer 284. The wall thickness of each ring-like spacer 234 and 284 is preferably minimized in order to maximize exposure of the porous structure surface area to the reactant gas as it enters or leaves each porous structure 22. Referring to FIG. 29, an alternative fixture 301 for pressure gradient densifying a stack of porous structures 303 is presented. Fixture 301 is essentially identical to fixture 200, except stack 303 comprises all "ID" ring-like spacers 284 disposed around the inside diameter of each porous structure.

The various components of fixtures 200, 201, 299 and 301 are preferably formed from graphite. The various joints comprised within the fixtures are preferably sealed using compressible ring-like gaskets from a flexible graphite material, as previously disclosed. If the porous structures 22 are compressible, they may be compressed directly against the ring-like spacers 234 to provide a sufficient seal and eliminate the need for compressible gaskets between the porous structures 22 and ring-like spacers 234. The ring-like spacers prior to use are preferably seal-coated with a surface deposition of pyrolytic carbon which facilitates removal of the ring-like spacer from a densified porous structure following deposition of the matrix.

Fixtures similar to fixtures 200 and 201 may be used in a conventional CVI/CVD process in which the ring-like spacers 234 are replaced by spacer blocks that separate the porous structures and permit the reactant gas to freely pass through, over, and around the porous structures 22. In such case, cover plate 110 may be replaced by cover plate 152 of FIG. 22 in order to promote dispersion of the reactant gas throughout the furnace volume. Cover plate 152 comprises an array of perforations 153. Sealing the various joints comprised within a fixture adapted for a conventional CVI/CVD process is not necessary or desirable.

Figure 19:
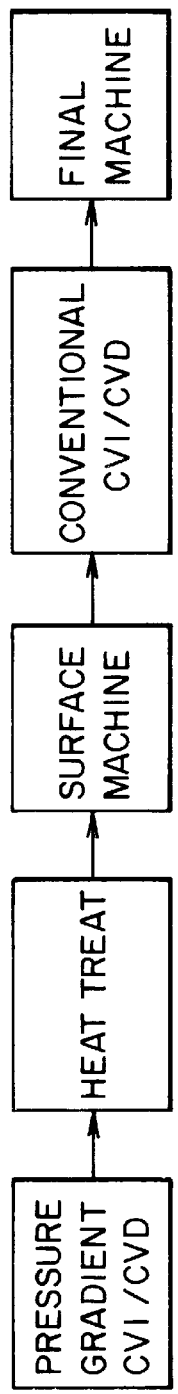
FIG. 19 presents a process according to an aspect of the invention.

Referring now to FIG. 19, a CVI/CVD process is presented according to an aspect of the invention. According to a preferred embodiment, a multitude of annular porous carbon structures are disposed within a CVI/CVD furnace such as furnace 400 (FIG. 15) using multiple fixtures such as fixture 201 (FIG. 18) which are sealed to multiple preheaters such as preheater 100. Reactant gas is supplied to the furnace using an apparatus such as the gas supply apparatus 402 (FIG. 15). The furnace is heated until conditions are stabilized, and a first carbon matrix is deposited within the porous structures by a pressure gradient CVI/CVD process. More support for the porous structures than depicted in FIGS. 17 and 18 during the pressure gradient CVI/CVD process is not necessary since the porous structures do not sag during the pressure gradient CVI/CVD process. The porous structures are then subjected to a heat treatment process without removing the porous structures from the furnace or from the fixtures. Alternatively, the porous structures may be removed from the furnace and pressure gradient CVI/CVD fixtures before the heat treatment process. The heat treatment process is conducted at a higher temperature than the previous deposition process temperatures which increases graphitization of the first carbon matrix. Following heat treatment, the porous structures are then removed from the furnace and surface machined in order to derive an accurate bulk density measurement. Machining the surface may also increase open porosity at the surface. A second carbon matrix is then deposited within the porous structures by a conventional CVI/CVD process. Thus, the second matrix overlies the first matrix. After reaching final density, the densified structures are machined into final parts. In certain embodiment, the pressure gradient CVI/CVD process and conventional CVI/CVD process are conducted at about 1750°–1900° F., and heat treatment is conducted at about 3300°–4000° F. Thus, the first matrix has a greater degree of graphitization than the second matrix due to the intermediate heat treatment process.

Figure 20:
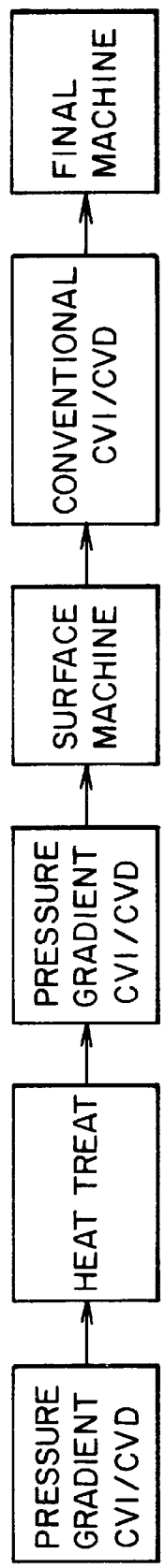
FIG. 20 presents a process according to an aspect of the invention.

Referring now to FIG. 20, an alternative process is presented that begins with a pressure gradient CVI/CVD process in which a first carbon matrix is deposited within the porous structures. The porous structures are then subjected to a heat treatment process without removing the porous structures from the furnace or from the fixtures. A second carbon matrix is then deposited in another pressure gradient CVI/CVD process that immediately follows the heat treatment process without removing the porous structures from the furnace or the fixtures. Alternatively, the porous structures may be removed from the furnace and pressure gradient CVI/CVD fixtures before the heat treatment process, and replaced in the pressure gradient CVI/CVD fixtures before the second pressure gradient CVI/CVD process. The porous structures are then subjected to a surface machining operation. Further second carbon matrix is then deposited in a conventional CVI/CVD process and the porous structures are machined into final parts. Leaving the porous structures in the same furnace and fixtures during the first and second pressure gradient processes and the heat treatment process results in a "continuous" process. Additional support blocks between adjacent pairs of porous structures in the pressure gradient CVI/CVD fixtures may be necessary in order to prevent sagging during the heat treatment process.

Figure 21:
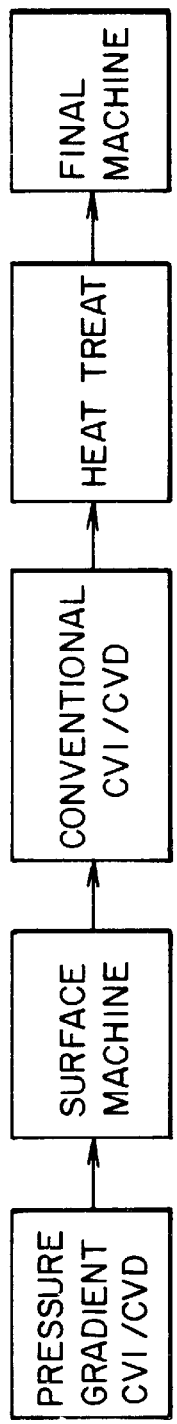
FIG. 21 presents a process according to an aspect of the invention.
Figure 22:
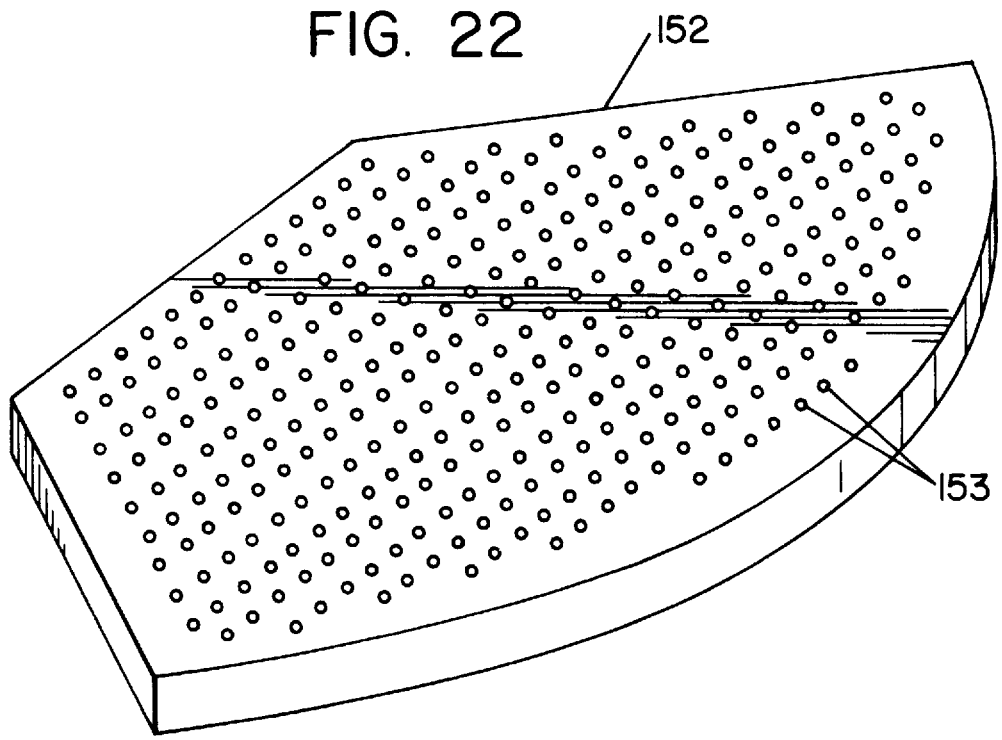
FIG. 22 presents an alternate cover plate for use with the preheater of FIG. 16.

Referring now to FIG. 21, an alternative process is presented that begins with a pressure gradient CVI/CVD process in which a first carbon matrix is deposited within the porous structures. The porous structures are surface machined and a second carbon matrix is then deposited in a conventional CVI/CVD process followed by a heat treatment process. After heat treatment, the fully densified porous structures are then machined into final parts. It is evident that the sequences of the FIG. 19–21 processes may be rearranged, and additional steps inserted, without departing from the invention.

The first carbon matrix and second carbon matrix preferably comprise a substantially rough laminar microstructure. A rough laminar microstructure has a greater density (about 2.1 g/cc), greater thermal conductivity, and lesser hardness than smooth laminar microstructure (1.9–2.0 g/cc or less). Rough laminar microstructure is particularly preferred in certain carbon/carbon aircraft brake disks. Microstructure may be optically characterized as described by M. L. Lieberman and H. O. Pierson, *Effect of Gas Phase Conditions on Resultant Matrix Pyrocarbons in Carbon/Carbon Composites,* 12 Carbon 233–41 (1974).

Figure 23:
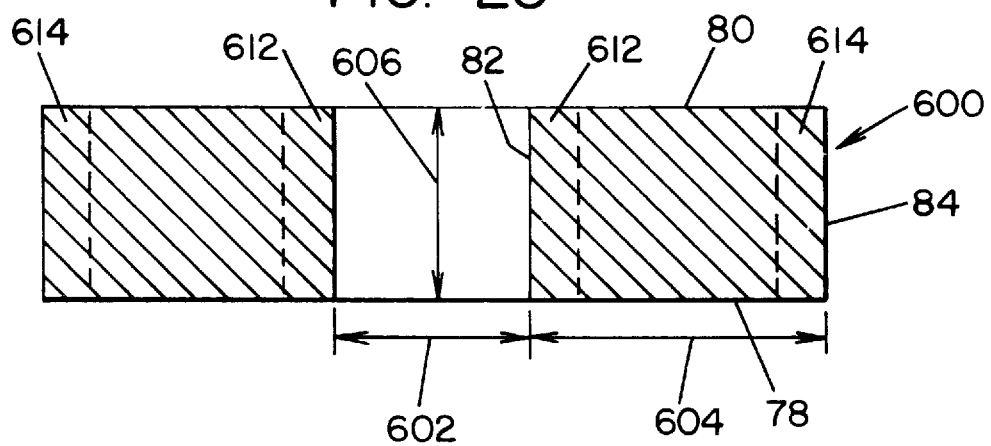
FIG. 23 presents a sectional view of a densified structure according to an aspect of the invention.

Referring now to FIG. 23, a densified porous structure 600 manufactured according to either the FIG. 19, 20 or 21 process is presented. The densified porous structure 600 comprises a first circumferential zone 612 adjacent the inside circumferential surface 82, and a second circumferential zone 514 adjacent the outside circumferential surface 84. The first and second circumferential zones 612 and 614 extend all the way through the thickness of the densified porous structure 600 and are bounded by the opposing surfaces 78 and 80. Densified porous structure 600 comprises a first carbon matrix deposited within a porous structure comprised of carbon fibers according to a pressure gradient CVI/CVD process. According to a preferred embodiment, the first carbon matrix is deposited by a process using fixtures 200 and/or 201 having all "OD" ring-like spacers 234 (FIGS. 17 and 18) which is similar to the process described in relation to FIG. 5, resulting in the first carbon matrix being deposited unevenly in a density distribution similar to densified porous structure 330 of FIG. 11. The first circumferential zone 612 is subjected to a greater reactant gas pressure than the second circumferential zone 614 during the pressure gradient CVI/CVD densification process which causes the first circumferential zone 612 to experience a greater bulk density gain than the second circumferential zone 614. According to a certain embodiment, the second circumferential zone 614 has about 15% less of the first carbon matrix per unit volume relative to the first circumferential zone 612, and the first carbon matrix preferably has a substantially rough laminar microstructure. The second circumferential zone 614 generally has at least 10% less of the first carbon matrix per unit volume relative to the first circumferential zone 612, and may have 20%, 30%, 40% or less of the first carbon matrix. Densified porous structure 600 also comprises a second carbon matrix overlying the first carbon matrix that is deposited by a conventional CVI/CVD process resulting in the densified porous structure 600 having a final density distribution similar to densified porous structure 340 of FIG. 12. The second carbon matrix also preferably has a substantially rough laminar microstructure. The first and second carbon matrices preferably have at least 90% rough laminar microstructure, more preferably at least 95% rough laminar microstructure, and in certain preferred embodiments 100% rough laminar microstructure.

The first carbon matrix may be heat treated which causes the first carbon matrix to be more graphitized than the second carbon matrix. Increasing graphitization increases the apparent density and thermal conductivity. Thus, the original density gradient from the pressure gradient CVI/CVD process may be identified in the densified porous structure 600 after deposition of the second carbon matrix. If the first carbon matrix has a distribution as shown in FIG. 11, the first circumferential portion 612 has a generally greater thermal conductivity than the second circumferential portion 614, and a generally greater apparent density than the second circumferential portion 614 even after the second carbon matrix is deposited. Closed porosity remaining within the densified porous structure 600 affects the measurement of apparent density. Porosity effects may be minimized by measuring apparent density of crushed samples which will be referred to herein as crushed apparent density. According to a certain technique, crushed apparent density is measured by cutting a specimen from a densified porous structure and fracturing the specimen between parallel steel platens of a load testing machine. The specimen is preferably fractured in a manner that maintains the specimen in one piece. This may be accomplished by compressing the sample past the yield point without fragmentation. Apparent density is then measured according to the Archimedes technique using mineral spirits such as Isopar M (synthetic isoparaffinic hydrocarbon) available from Exxon Chemical Americas, Houston, Tex., U.S.A. Vacuum is used to force the mineral spirits into the structure. Apparent density is a measurement of the density of the material that is impervious to penetration by the mineral spirits. Fracturing the specimen opens previously closed porosity that was impervious to penetration by the mineral spirits and minimizes porosity effects. Alternatively, crushed apparent density of a pulverized sample may be measured using a helium pyconometer. Measurements of densified porous structures processed similar to densified porous structure 600 demonstrated that the crushed impervious density adjacent the inside circumferential surface 82 was consistently at least 0.2% greater, and may be as much as 0.4% and 0.5% greater, than adjacent the outside circumferential surface 84. Thus, crushed apparent density tends to generally decrease from the inside surface 82 to the outside surface 84.

Thermal conductivity of densified porous structures similar to densified porous structure 600 (as described in the immediately preceding paragraph) was measured in two directions: normal to the opposing surfaces 78 and 80 which will be referred to as "thermal flat conductivity", and normal to the circumferential surfaces 82 and 84 (in the radial direction) which will be referred to as "thermal edge conductivity." Thermal flat conductivity of circumferential portion 514 was at least 5% less than circumferential portion 512 when measured at the opposing surfaces 78 and 80. Thermal flat conductivity of circumferential portion 614 was at least 12% less than circumferential portion 612 at one-half of the distance between opposing surfaces 78 and 80. Thermal edge conductivity of circumferential portion 514 was at least 5% less than circumferential portion 512 when measured at the opposing surfaces 78 and 80. Thermal edge conductivity of circumferential portion 614 was at least 4% less than circumferential portion 612 when measured at one-half of the distance between opposing surfaces 78 and 80. Thus, thermal conductivity tends to generally decrease from the inside circumferential portion 612 to the outside circumferential portion 614. This trend is induced by the first matrix being more graphitized than the second matrix.

The following examples further illustrate various aspects of the invention.

EXAMPLE 1

A base-line was established for a conventional CVI/CVD process as follows. A fibrous textile structure about 1.5 inch thick was manufactured according to FIGS. 1 through 4 of U.S. Pat. No. 4,790,052 starting with a 320K tow of unidirectional polyacrylonitrile fiber. An annular porous structure was then cut from the textile structure having an outside diameter of about 7.5 inch, an inside diameter of about 2.5 inch. The annular porous structure was then pyrolyzed to transform the fibers to carbon. The pyrolyzed porous structure, having a bulk density of 0.49 g/cc, was then placed in a furnace similar to furnace 11 of FIG. 14. Pressure was reduced to 10 torr inside the furnace volume and the furnace was heated and stabilized at a temperature of about 1860° F. when measured by a temperature sensor positioned as temperature sensor 76 of FIG. 14. A reactant gas mixture was introduced as described in relation to FIG. 14 and allowed to freely disperse over and around the porous structure in a manner typical of a conventional CVI/CVD process. The reactant gas mixture was comprised of 87% (volume percent) natural gas and 13% propane at a flow rate of 4000 sccm (standard cubic centimeters per minute) and a residence time of about 1 second in the reactor volume. The natural gas had a composition of 96.4% methane (volume percent), 1.80% ethane, 0.50% propane, 0.15% butane, 0.05% pentane, 0.70% carbon dioxide, and 0.40% nitrogen. The process was stopped three times to measure bulk density gain of the porous structure. Total deposition process time was 306 hours. An average rate of deposition was calculated for each of the three densification runs. The test conditions and data from this example are presented in Table 1, including cumulative deposition time (Cum. Time) and total density gain (Density Gain) at each cumulative time noted. The carbon matrix deposited within the densified porous structure at the end of the process comprised nearly all rough laminar microstructure with minimal deposits of smooth laminar microstructure at the surface of the porous structure.

TABLE 1

| Cum. Time (hour) | Gas Flow Rate (sccm) | Part Temp. (F.°) | Density Gain (g/cc) |
|---|---|---|---|
| 41 | 4000 | 1857 | 0.310 |
| 166 | 4000 | 1860 | 0.886 |
| 306 | 4000 | 1855 | 1.101 |

EXAMPLE 2

An annular porous structure having a thickness of 1.6 inch, an outside diameter of 6.2 inch, and an inside diameter of 1.4 inch was cut from a fibrous textile structure and processed according to Example 1 by a conventional CVI/CVD process. The test conditions and data from this example are presented in Table 2.

TABLE 2

| Cum. Time (hour) | Gas Flow Rate (sccm) | Part Temp. (F.°) | Density Gain (g/cc) |
|---|---|---|---|
| 92 | 4000 | 1858 | 0.370 |

EXAMPLE 3

Two annular porous structures (Disks A and B), prepared from a fibrous textile structure and having the same dimensions as described in Example 1, were densified by a pressure gradient CVI/CVD process using a furnace similar to furnace 10 of FIG. 1, a fixture similar to fixture 2 of FIG. 2 having ID/OD spacers, and the reactant gas mixture of Example 1. The test conditions and data from this example are presented in Table 3. Furnace pressure was 10 torr. Temperature of the gas stream was estimated to be 1740° F. when measured by a temperature sensor such as temperature sensor 74 of FIG. 1. The gas was forced to flow through the porous structure, as previously described in relation to FIG. 2, at a flow rate of 4000 sccm. The carbon matrix deposited within Disk A comprised all rough laminar microstructure. The microstructure of Disk B was not evaluated. Disk A was cut into smaller samples and the bulk density measurements of these samples were determined using the Archimedes method, and demonstrated a density profile similar to FIG. 8.

TABLE 3

| Disk | Run Time (Hour) | Gas Flow Rate (sccm) | Part Temp. (F.°) | Density Gain (g/cc) |
|---|---|---|---|---|
| A | 165 | 4000 | 1861 | 1.106 |
| B | 123 | 4000 | 1859 | 0.928 |

EXAMPLE 4

Three annular porous structures (Disks A, B and C) were prepared and individually densified by a pressure gradient CVI/CVD process according to Example 3 except that the porous structures were flipped part way through the process in order to obtain a more uniform final density distribution. Temperature of the gas stream was approximately 1740° F. when measured by a temperature sensor such as temperature sensor 74 of FIG. 1. The test conditions and data from this example are presented in Table 4. The carbon matrix deposited within Disks A and C was all rough laminar before the flip, and essentially smooth laminar after the flip. The microstructure of Disk B was not determined. The final densified porous structures had density profiles similar to FIG. 9.

TABLE 4

| Disk | Cum. Time (Hour) | Gas Flow Rate (sccm) | Part Temp. (F.°) | Density Gain (g/cc) |
|---|---|---|---|---|
| A | 72 | 4000 | 1859 | 0.743 |
|  | Flip |  |  |  |
|  | 96 | 4000 | 1859 | 0.853 |
|  | 111 | 4000 | 1855 | 1.034 |
| B | 49 | 4000 | 1854 | 0.619 |
|  | Flip |  |  |  |
|  | 74 | 4000 | 1849 | 0.898 |
| C | 49 | 4000 | 1858 | 0.625 |
|  | Flip |  |  |  |
|  | 75 | 4000 | 1853 | 0.915 |

EXAMPLE 5

Two annular porous structures, prepared from a fibrous textile structure and having the same dimensions as described in Example 1, were simultaneously densified by a pressure gradient CVI/CVD process with a fixture similar to fixture 6 of FIG. 4 having all "ID" spacers, and the reactant gas mixture of Example 1. Temperature of the gas stream was estimated 1745° F. when measured by a temperature sensor such as temperature sensor 74 of FIG. 1. The test conditions and data from this example are presented in Table 5. Density gain on Table 5 is an average for the two disks. The carbon matrix deposited within the densified porous structure at the end of the process comprised all rough laminar microstructure. Computed tomagraphy scans of the disk demonstrated density profiles similar to FIG. 10.

TABLE 5

| Cum. Time (hour) | Gas Flow Rate (sccm) | Part Temp. (F.°) | Density Gain (g/cc) |
|---|---|---|---|
| 24.4 | 8000 | 1860 | 0.262 |
| 70.7 | 8000 | 1856 | 0.593 |

EXAMPLE 6

Four annular porous structures, prepared from a fibrous textile structure and having the same dimensions as described in Example 1, were densified by a pressure gradient CVI/CVD process using a fixture similar to fixture 8 of FIG. 5 having all "OD" spacers, and the reactant gas mixture of Example 1. Two disks were simultaneously densified (Disk Pair A and B) and reactant gas flow rate was doubled to maintain a flow rate of 4000 sccm per disk. Temperature of the gas stream was approximately 1750° F. when measured by a temperature sensor such as temperature sensor 74 of FIG. 1. The test conditions and data from this example are presented in Table 6. The density gain on Table 6 is an average for each disk pair. The carbon matrix deposited within the densified porous structure at the end of the process comprised all rough laminar microstructure. Computed tomography scans of Disk Pair B demonstrated density profiles similar to FIG. 11.

TABLE 6

| Disk Pair | Run Time (Hour) | Gas Flow Rate (sccm) | Part Temp. (F.°) | Density Gain (g/cc) |
|---|---|---|---|---|
| A | 70 | 8000 | 1860 | 0.951 |
| B | 70 | 8000 | 1855 | 0.861 |

EXAMPLE 7

An annular porous structure was prepared from a fibrous textile structure, having the same dimensions as described in Example 2, and densified by a pressure gradient CVI/CVD process using a fixture similar to fixture 7 of FIG. 7 having all "ID" seals with a reverse flow process, and the reactant gas mixture of Example 1. Temperature of the gas stream was estimated 1730° F. when measured by a temperature sensor such as temperature sensor 74 of FIG. 1. The reactant gas was forced to flow through the porous structure as previously described in relation to FIG. 7 at a flow rate of 3000 sccm (the flow was lowered since the disk was smaller than the disks used in Examples 3–6). The test conditions and data from this example are presented in Table 7. The carbon matrix deposited within the densified porous structure at the end of the process comprised mostly smooth laminar microstructure.

TABLE 7

| Cum. Time (hour) | Gas Flow Rate (sccm) | Part Temp. (F.°) | Density Gain (g/cc) |
|---|---|---|---|
| 50 | 3000 | 1854 | 0.987 |

Figure 24:
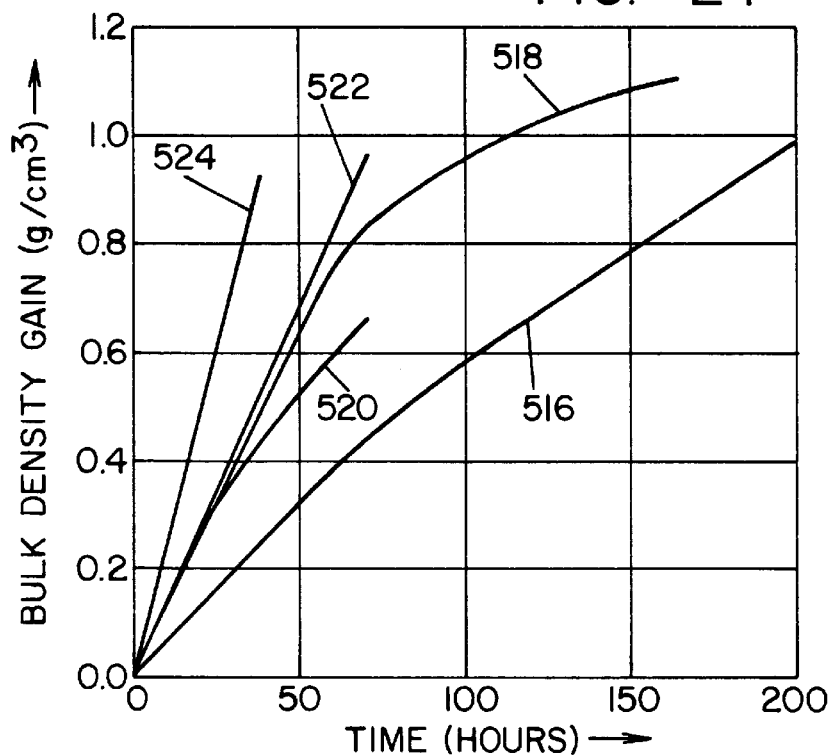
FIG. 24 presents a graph showing bulk density gain versus time for a variety of processes according to the invention.

Referring now to FIG. 24, the data presented on Tables 1 through 7 is depicted in graphical form. The data from Tables 1 and 2 is presented as a single smoothed curve 516 representing conventional CVI/CVD. The data from Tables 3 and 4 is presented as a single smoothed curve 518 representing pressure gradient CVI/CVD using "ID/OD" spacers. The data from Table 5 is presented as a single smoothed curve 520 representing pressure gradient CVI/CVD using all "ID" spacers. The data from Table 6 is presented as a single smoothed curve 522 representing pressure gradient CVI/CVD using all "OD" spacers. The data from Table 7 is presented as curve 524 representing reverse flow pressure gradient CVI/CVD with all "ID" spacers. Densification rates increased by factors from about one and one-half to five times conventional CVI/CVD densification rates. Time to achieve a bulk density increase of 1 g/cc was reduced by about 25% to 80% relative to conventional CVI/CVD time. The importance of eliminating as many leaks as possible is apparent from FIG. 24. Any leakage tends to decrease the densification rate from the maximum attainable rate. Increased densification rates may be achieved even with a small amount of leakage. Thus, some leakage may occur while remaining within the purview of the invention.

Figure 25:
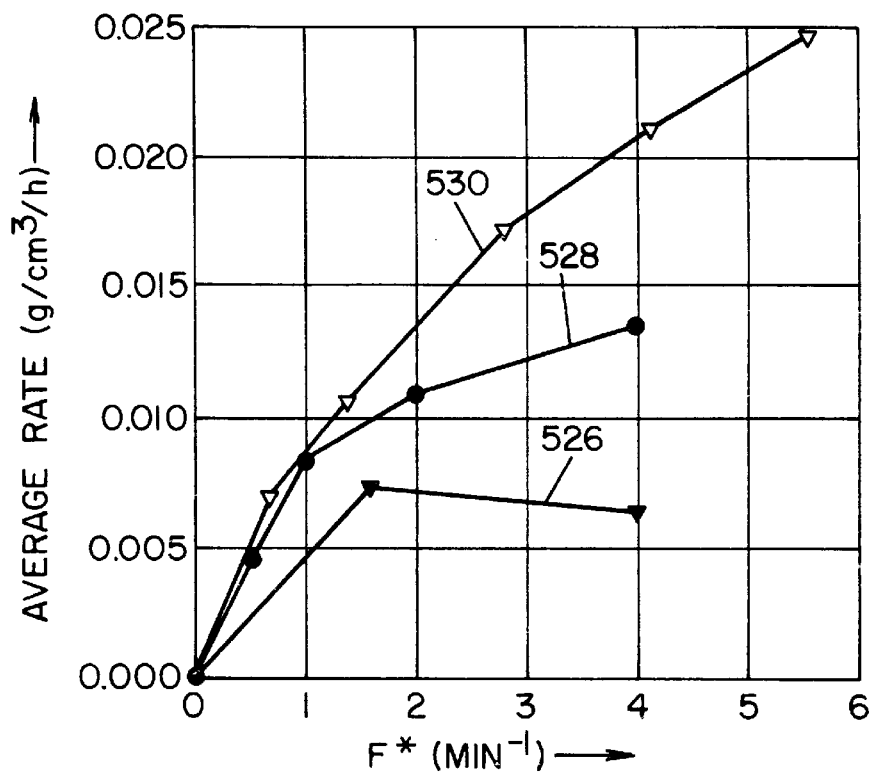
FIG. 25 presents a graph showing average deposition rate versus normalized reactant gas flow for a variety of processes according to the invention.

Referring now to FIG. 25, curves representing densification rate versus normalized flow are presented. The normalized flow is indicated as $F^*$ and represents a quantity of flow per unit of disk volume (for example, 4000 sccm per 1000 cc disk volume=4 $min^{-1}$). Additional tests were run according to Example 6 and 7 above except flow rates of reactant gas were varied from one test to the next. The data from tests conducted according to Example 6 with varying flow are presented on Tables 8, and the data from tests conducted according to Example 7 with varying flow are presented on Table 9. A curve 526 represents conventional CVI/CVD. Data from Table 8 is presented as curve 528 which represents pressure gradient CVI/CVD with all "OD" spacers (FIG. 5). Data from Table 9 is presented as curve 530 which represents reverse flow pressure gradient CVI/CVD with all "ID" spacers (FIG. 7).

TABLE 8

| Cum. Time (hour) | Gas Flow Rate (sccm) | Part Temp. (0F) | Density Gain (g/cc) | Average Deposition Rate (g/cc/h) |
|---|---|---|---|---|
| 50 | 1000 | 1853 | 0.232 | 0.0046 |
| 50 | 2000 | 1856 | 0.414 | 0.0083 |
| 50 | 4000 | 1851 | 0.547 | 0.0109 |
| 70 | 8000 | 1858 | 0.906 | 0.0129 |

TABLE 9

| Cum. Time (hour) | Gas Flow Rate (sccm) | Part Temp. (°F.) | Density Gain (g/cc) | Average Deposition Rate (g/cc/h) |
|---|---|---|---|---|
| 50 | 500 | 1852 | 0.323 | 0.0065 |
| 50 | 1000 | 1853 | 0.498 | 0.0100 |
| 56 | 2000 | 1855 | 0.920 | 0.0164 |
| 46 | 3000 | 1854 | 0.987 | 0.0215 |
| 38 | 4000 | 1852 | 0.919 | 0.0242 |

Figure 26:
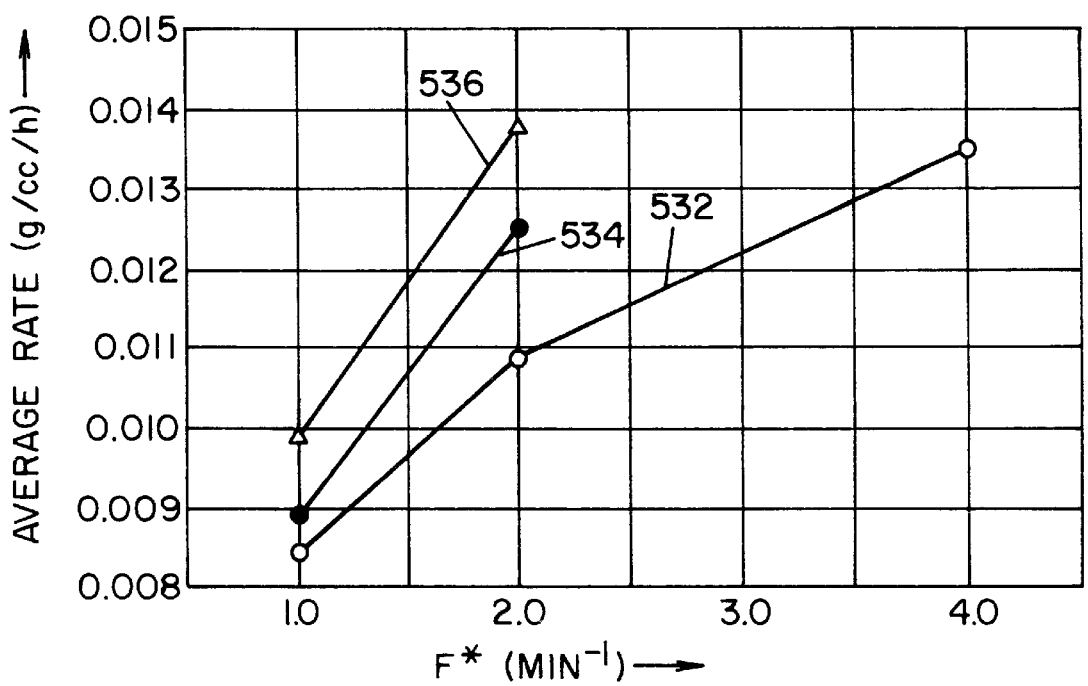
FIG. 26 presents a graph showing average deposition rate versus normalized reactant gas flow for a variety of reactor volume pressures according to an aspect of the invention.

Referring now to FIG. 26, curves representing densification rate versus normalized flow are presented. Additional tests were run according to Example 6 (pressure gradient with all "OD" spacers) above except the furnace volume pressure and flow rates of reactant gas were varied from one test to the next.

The data from these tests is presented in Table 10. Data from Table 10 is presented as three curves 532, 534, and 536. Curve 532 represents data at a furnace volume pressure of 10 torr when measured by a pressure sensor such as sensor 72 of FIG. 1. Curve 534 represents data at a furnace volume pressure of 25 torr when measured by a pressure sensor such as sensor 72 of FIG. 1. Curve 532 represents data at a furnace volume pressure of 50 torr when measured by a pressure sensor such as sensor 72 of FIG. 1. The matrix deposited in all of these tests comprised all rough laminar microstructure. As demonstrated by FIG. 26, additional gains in densification rate may be realized by increasing the furnace volume pressure (Reactor Pressure) while maintaining a desired rough laminar microstructure. This was a surprising discovery.

TABLE 10

| Cum. Time (hour) | Reactor Pressure (torr) | Gas Flow Rate (sccm) | Part Temp. (°F.) | Density Gain (g/cc) | Average Deposition Rate (g/cc/h) |
|---|---|---|---|---|---|
| 50 | 10 | 2000 | 1856 | 0.414 | 0.0083 |
| 50 | 10 | 4000 | 1851 | 0.547 | 0.0109 |
| 70 | 10 | 8000 | 1858 | 0.906 | 0.0129 |
| 50 | 25 | 2000 | 1853 | 0.449 | 0.0090 |
| 50 | 25 | 4000 | 1853 | 0.611 | 0.0122 |
| 50 | 50 | 2000 | 1853 | 0.493 | 0.0099 |
| 50 | 50 | 4000 | 1852 | 0.683 | 0.0137 |

Figure 27:
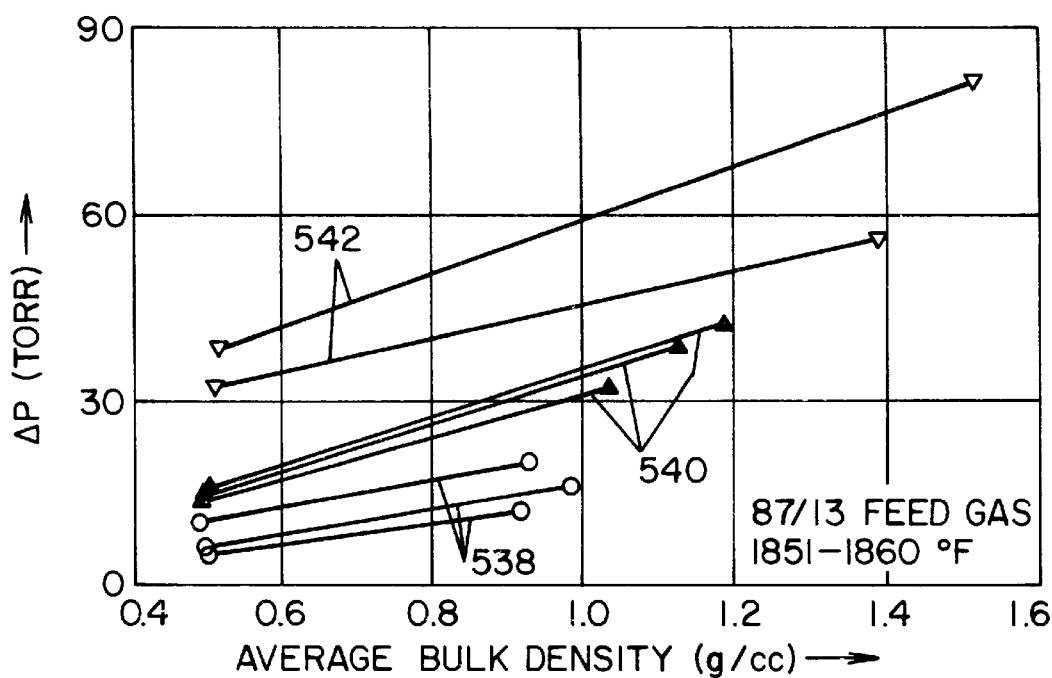
FIG. 27 presents a graph showing change in pressure across the porous wall versus average bulk density for a variety of reactant gas flow rates and reactor volume pressures according to an aspect of the invention.

Referring now to FIG. 27, pressure differential across the porous structure versus bulk density is presented for several reactant gas flow rates. Additional tests were run according to Example 6 with varying flow rates. Data from these tests is presented in Table 11. The data from Table 11 is presented in FIG. 27 as a first set of curves 538 for a flow rate of 1000 sccm per disk, a second set of curves 540 for a flow rate of 2000 sccm per disk, and a third set of curves 542 for a flow rate of 4000 sccm per disk. The matrix deposited in all of these tests comprised all rough laminar microstructure. Table 11 includes the initial pressure differential across the porous structures (Init. Delta P), final pressure differential across the porous structures (Final Delta P), and furnace volume pressure (Reactor Pressure) which was maintained constant. As demonstrated by FIG. 27, the pressure gradient across the porous structure may be at least as high as 80 torr (which indicates 90 torr on the high pressure side of the porous structure) while maintaining a desired rough laminar microstructure.

TABLE 11

| Cum. Time (h.) | Gas Flow Rate (sccm) | Temp (°F.) | Density Gain (g/cc) | Average Deposit. Rate (g/cc/h) | Init. Delta P (torr) | Final Delta P (torr) | Reactor Pressure (torr) |
|---|---|---|---|---|---|---|---|
| 50 | 2000 | 1856 | 0.414 | 0.0083 | 5 | 12 | 10 |
| 50 | 2000 | 1853 | 0.449 | 0.0090 | 10 | 20 | 25 |
| 50 | 2000 | 1853 | 0.493 | 0.0099 | 6 | 16 | 50 |
| 50 | 4000 | 1851 | 0.547 | 0.0109 | 14 | 32 | 10 |
| 50 | 4000 | 1853 | 0.611 | 0.0122 | 15 | 39 | 25 |
| 50 | 4000 | 1852 | 0.683 | 0.0137 | 15 | 42 | 50 |
| 70 | 8000 | 1860 | 0.951 | 0.0136 | 38 | 81 | 10 |
| 70 | 8000 | 1855 | 0.861 | 0.0123 | 32 | 56 | 10 |

Tests have demonstrated that the pressure gradient CVI/CVD process according to the invention may be conducted with a part temperature in the range of 1800°–2000° F., a reactor pressure in the range of 10–150 torr, normalized reactant gas flow rate (F*) in the range of 0.4–10 $\min^{-1}$, and with a hydrocarbon reactant gas mixture of natural gas and 0–40% (volume percent) propane. Conducting the process within these ranges generally produces a rough laminar and/or smooth laminar microstructure. Conducting the process with all of these process parameters at or near the high extreme of each of these ranges may result in tarring or sooting. Other carbon bearing gases, pressures, and temperatures known in the art for CVI/CVD processes may be substituted without departing from the invention.

Densifying a porous structure by a pressure gradient CVI/CVD process according to the invention followed by a conventional CVI/CVD process produces a densified porous structure having a more uniform density distribution than a comparable porous structure densified only by a conventional CVI/CVD process. According to a certain embodiment, for example, an annular porous carbon structure having an inside diameter of about 10.5 inches (indicated as 602 in FIG. 23), a web (indicated as 604 in FIG. 23) of about 5.25 inches, and a thickness (indicated as 606 in FIG. 23) of about 1.25 inches, is densified first with a carbon matrix deposited by a pressure gradient CVI/CVD process (Example 6 conditions) using a fixture such as fixture 201 (FIG. 18) in furnace such as furnace 400 (FIG. 15) resulting in a density distribution similar to densified structure 330 of FIG. 11. Carbon matrix is further deposited by a conventional CVI/CVD process (Example 1 conditions) resulting in a density distribution similar to densified structure 340 of FIG. 12, and having a mean bulk density of about 1.77 g/cc. According to standard statistical practice, the standard deviation of the bulk density throughout the densified structure is about 0.06 g/cc. The standard deviation of the bulk density throughout a comparable porous carbon structure densified to an equivalent mean bulk density by only conventional CVI/CVD processes is about 0.09 g/cc. Thus, a porous structure densified by a pressure gradient CVI/CVD process followed by a conventional CVI/CVD process is more uniform than a porous structure densified by only conventional CVI/CVD processes. Circumferential as well as total variation is reduced. Uniformity is desirable for carbon/carbon aircraft brake disks.

The standard deviation of the bulk density throughout a carbon/carbon structure manufactured according to the invention is preferably less than or equal to 0.07 g/cc, is more preferably less than or equal to 0.06 g/cc or 0.05 g/cc, and is most preferably less than or equal to 0.04 or 0.03 g/cc. Coefficient of variation of bulk density in any densified porous structure is preferably less than or equal to 4%, more preferably less than or equal to 3.5% or 3%, and most preferably less than or equal to 2.3% or 1.8%.

It is evident that many variations are possible without departing from the scope of the invention as defined by the claims that follow.

What is claimed is:

1. An apparatus for CVI/CVD densifying porous aircraft brake structures, comprising:
   a CVI/CVD furnace for densifying porous aircraft brake structures;
   a controller;
   a first main gas line for supplying a first reactant gas;
   a second main gas line for supplying a second reactant gas;
   a plurality of furnace supply lines in fluid communication with said first main gas line, said second main gas line, and said CVI/CVD furnace;
   a plurality of first flow meters that measure a quantity of first reactant gas flow through each furnace supply line, and communicate with said controller;
   a plurality of second flow meters that measure a quantity of second reactant gas flow through each furnace supply line, and communicate with said controller;
   a plurality of first control valves configured to control said quantity of flow of said first reactant gas through each furnace supply line, said controller controlling said plurality of first control valves; and,
   a plurality of second control valves configured to control said quantity of flow of said second reactant gas through each furnace supply line, said controller controlling said plurality of second control valves, said controller being adapted to control said plurality of first control valves and said plurality of second control valves to provide a mixture of said first and second reactant gases to said plurality of furnace supply lines.

2. The apparatus of claim 1, wherein said quantity of flow is different for each furnace supply line.

3. The apparatus of claim 1, wherein each furnace supply line comprises one first flow meter and one first control valve.

4. The apparatus of claim 1, further comprising a first main control valve disposed within said first main gas line.

5. An apparatus for CVI/CVD densifying a plurality of porous aircraft brake disk structures, comprising:
   a CVI/CVD furnace that defines a furnace volume;
   a vacuum apparatus in fluid communication with said furnace volume;
   a first main gas line for supplying a first reactant gas;
   a plurality of furnace supply lines in fluid communication with said first main gas line; and,
   a plurality of stacks of the porous aircraft brake disk structures disposed within said furnace volume, each stack defining an enclosed cavity, at least two of said enclosed cavities being in fluid communication with a different furnace supply line and sealed within said furnace volume such that a reactant gas flow introduced into each enclosed cavity through the corresponding furnace supply line is forced to disperse through said porous aircraft brake disk structures before being withdrawn from said furnace volume by said vacuum apparatus.

6. The apparatus of claim 5, further comprising a first main control valve disposed within said first main supply line.

7. The apparatus of claim 6, wherein each furnace supply line comprises one first flow meter and one first control valve, said one first flow meter communicating with a controller, said controller controlling said one first control valve.

8. The apparatus of claim 6, further comprising:
   a second main gas line for supplying a second reactant gas, said furnace supply lines being in fluid communication with said second main gas line.

9. The apparatus of claim 8, further comprising:
   a plurality of second flow meters that measure a quantity of second reactant gas flow through each furnace supply line; and,
   a plurality of second control valves configured to control said quantity of flow of said second reactant gas through each furnace supply line.

10. The apparatus of claim 5, further comprising:
    a plurality of first flow meters that measure a quantity of first reactant gas flow through each furnace supply line; and,
    a plurality of first control valves configured to control said quantity of flow of the first reactant gas through each furnace supply line.

11. The apparatus of claim 10, wherein said quantity of first reactant gas flow is different for each furnace supply line.

12. The apparatus of claim 5, comprising a multitude of stacks of porous aircraft brake disk structures disposed within said furnace volume, each stack defining an enclosed cavity, and wherein at least one furnace supply line is in fluid communication with at least two corresponding enclosed cavities.

13. An apparatus for CVI/CVD densifying a plurality of porous aircraft brake disk structures, comprising:
    a CVI/CVD furnace that defines a furnace volume;
    a vacuum apparatus in fluid communication with said furnace volume;
    a first main gas line for supplying a first reactant gas;
    a plurality of furnace supply lines in fluid communication with said first main gas line; and,
    a plurality of stacks of the porous aircraft brake disk structures disposed within said furnace volume, each stack defining an enclosed cavity, each furnace supply line being in fluid communication with at least one corresponding enclosed cavity, said stacks of porous aircraft brake disk structures being sealed within said furnace volume such that reactant gas flow introduced through each furnace supply line into said corresponding enclosed cavity is forced to disperse through said stack of porous aircraft brake disk structures that defines said corresponding enclosed cavity before being withdrawn from said furnace volume by said vacuum apparatus.

14. The apparatus of claim 13, wherein said quantity of first reactant gas flow is different for each furnace supply line.

15. The apparatus of claim 13, comprising a multitude of stacks of porous aircraft brake disk structures disposed within said furnace volume, each stack of porous aircraft brake disk structures defining an enclosed cavity, and wherein at least one furnace supply line is in fluid communication with at least two corresponding enclosed cavities.

16. The apparatus of claim 13, further comprising a plurality of first control valves configured to control a quantity of flow of the first reactant gas through each furnace supply line.

17. An apparatus for CVI/CVD densifying a plurality of porous walls, comprising:
- a CVI/CVD furnace that defines a furnace volume;
- a vacuum apparatus in fluid communication with said furnace volume;
- a controller;
- a first main gas line for supplying a first reactant gas;
- a second main gas line for supplying a second reactant gas;
- a plurality of furnace supply lines in fluid communication with said first main gas line and said second main gas line;
- a plurality of first flow meters that measure a quantity of first reactant gas flow through each furnace supply line, and communicate with said controller;
- a plurality of second flow meters that measure a quantity of second reactant gas flow through each furnace supply line, and communicate with said controller;
- a plurality of first control valves configured to control said quantity of flow of the first reactant gas through each furnace supply line, said controller controlling said plurality of first control valves;
- a plurality of second control valves configured to control said quantity of flow of the second reactant gas through each furnace supply line, said controller controlling said plurality of second control valves; and,
- a plurality of porous walls disposed within said furnace volume, each porous wall defining an enclosed cavity, each furnace supply line being in fluid communication with at least one corresponding enclosed cavity, said porous walls being sealed within said furnace volume such that reactant gas flow introduced through each furnace supply line into said corresponding enclosed cavity is forced to disperse through said porous wall that defines said corresponding enclosed cavity before being withdrawn from said furnace volume by said vacuum apparatus.

18. The apparatus of claim 17, wherein said quantity of first reactant gas flow is different for each furnace supply line.

19. An apparatus for CVI/CVD densifying a plurality of stacks of porous aircraft brake structures, comprising:
- a CVI/CVD furnace that defines a furnace volume;
- a vacuum apparatus in fluid communication with said furnace volume;
- a controller;
- a first main gas line for supplying a first reactant gas;
- a second main gas line for supplying a second reactant gas;
- a plurality of furnace supply lines in fluid communication with said first main gas line and said second main gas line;
- a plurality of first flow meters that measure a quantity of first reactant gas flow through each furnace supply line, and communicate with said controller;
- a plurality of second flow meters that measure a quantity of second reactant gas flow through each furnace supply line, and communicate with said controller;
- a plurality of first control valves configured to control said quantity of flow of the first reactant gas through each furnace supply line, said controller controlling said plurality of first control valves;
- a plurality of second control valves configured to control said quantity of flow of the second reactant gas through each furnace supply line, said controller controlling said plurality of second control valves; and,
- a plurality of stacks of porous aircraft brake disk structures disposed within said furnace volume, each stack of porous aircraft brake disk structures defining an enclosed cavity, each furnace supply line being in fluid communication with at least one corresponding enclosed cavity, said stacks of porous aircraft brake disk structures being sealed within said furnace volume such that reactant gas flow introduced through each furnace supply line into said corresponding enclosed cavity is forced to disperse through said stack of porous aircraft brake disk structures that defines said corresponding enclosed cavity before being withdrawn from said furnace volume by said vacuum apparatus.

20. The apparatus of claim 19, wherein said quantity of first reactant gas flow is different for each furnace supply line.

* * * * *

UNITED STATES PATENT AND TRADEMARK OFFICE
CERTIFICATE OF CORRECTION

PATENT NO.  : 5,853,485
DATED       : December 29, 1998
INVENTOR(S) : James W. Rudolph et al.

It is certified that error appears in the above-identified patent and that said Letters Patent is hereby corrected as shown below:

On title page, item 60 Related U.S. Application
  replace "340,150, Nov. 15, 1995"
  with --340,510, Nov. 16, 1994--.
Col. 1, line 8
  replace "08/340,150"
  with --08/340,510--.

Signed and Sealed this

Twenty-fourth Day of August, 1999

Attest:

Q. TODD DICKINSON

*Attesting Officer*     Acting Commissioner of Patents and Trademarks